(12) United States Patent
Standing et al.

(10) Patent No.: US 11,621,230 B2
(45) Date of Patent: Apr. 4, 2023

(54) ELECTRICAL DEVICES AND METHODS OF MANUFACTURE

(71) Applicant: FARADAY SEMI, INC., Irvine, CA (US)

(72) Inventors: Martin Standing, Velden (AT); Parviz Parto, Laguna Niguel, CA (US)

(73) Assignee: Faraday Semi, Inc., Irvine, CA (US)

( * ) Notice: Subject to any disclaimer, the term of this patent is extended or adjusted under 35 U.S.C. 154(b) by 60 days.

(21) Appl. No.: 17/371,825

(22) Filed: Jul. 9, 2021

(65) Prior Publication Data

US 2022/0068823 A1     Mar. 3, 2022

Related U.S. Application Data

(62) Division of application No. 16/851,032, filed on Apr. 16, 2020, now Pat. No. 11,069,624.

(Continued)

(51) Int. Cl.
*H01L 23/538* (2006.01)
*H01L 23/00* (2006.01)
(Continued)

(52) U.S. Cl.
CPC ...... *H01L 23/5389* (2013.01); *H01L 21/4853* (2013.01); *H01L 21/4857* (2013.01);
(Continued)

(58) Field of Classification Search
CPC ............. H01L 23/5389; H01L 21/4853; H01L 21/4857
See application file for complete search history.

(56) References Cited

U.S. PATENT DOCUMENTS 3,327,202 A    6/1967   Mills
3,329,887 A    7/1967   Schaeve
(Continued)

FOREIGN PATENT DOCUMENTS

CN     104143547     11/2014
CN     104158392     11/2014
(Continued)

OTHER PUBLICATIONS

"Bootstrap Circuit in the Buck Converter," ROHM Semiconductor, Switching Regulator IC Series, dated Nov. 2018, in 5 pages.
(Continued)

*Primary Examiner* — Anthony Ho
(74) *Attorney, Agent, or Firm* — Knobbe, Martens, Olson & Bear, LLP

(57) ABSTRACT

A die can be applied to a front conductive layer. Openings can be formed in the conductive layer over contact points on the die. The openings can be filled with a conductive material to electrically couple the conductive layer to the contact points on the die. The front conductive layer can be etched to form a first conductive pattern. Conductive standoffs can be formed on portions of the front conductive layer. An additional front conductive layer can be laminated onto the front side. Openings can be formed in the additional front conductive layer over the standoffs. The openings can be filled with a conductive material to electrically couple the additional conductive layer to the underlying standoffs. The additional conductive layer can be etched to form a second conductive pattern.

9 Claims, 20 Drawing Sheets

Related U.S. Application Data

(60) Provisional application No. 62/835,357, filed on Apr. 17, 2019.

(51) Int. Cl.
*H01L 21/48* (2006.01)
*H01L 21/56* (2006.01)
*H01L 21/78* (2006.01)
*H01L 23/31* (2006.01)

(52) U.S. Cl.
CPC ........ *H01L 21/4864* (2013.01); *H01L 21/565* (2013.01); *H01L 21/78* (2013.01); *H01L 23/3121* (2013.01); *H01L 23/5383* (2013.01); *H01L 23/5386* (2013.01); *H01L 24/19* (2013.01); *H01L 24/20* (2013.01); *H01L 2224/214* (2013.01); *H01L 2924/1205* (2013.01); *H01L 2924/1206* (2013.01); *H01L 2924/14252* (2013.01)

(56) References Cited

U.S. PATENT DOCUMENTS

| | | | |
|---|---|---|---|
| 3,474,289 A | 10/1969 | Stone | |
| 3,678,937 A | 7/1972 | Cole et al. | |
| 3,795,247 A | 3/1974 | Thaler | |
| 3,888,260 A | 6/1975 | Fischell | |
| 3,978,838 A | 9/1976 | Oister | |
| 4,163,968 A | 8/1979 | Davis | |
| 4,184,197 A | 1/1980 | Cuk et al. | |
| 4,412,212 A | 10/1983 | Kolegraff et al. | |
| 4,471,283 A | 9/1984 | Presley | |
| 5,287,261 A | 2/1994 | Ehsani | |
| 5,663,635 A | 9/1997 | Vinciarelli et al. | |
| 5,747,976 A | 5/1998 | Wong | |
| 5,773,966 A | 6/1998 | Steigerwald | |
| 5,886,508 A | 3/1999 | Jutras | |
| 5,949,264 A | 9/1999 | Lo | |
| 6,034,514 A | 3/2000 | Sakai | |
| 6,051,961 A | 4/2000 | Jang et al. | |
| 6,278,264 B1 | 8/2001 | Burstein et al. | |
| 6,304,065 B1 | 10/2001 | Wittenbreder | |
| 6,304,460 B1 | 10/2001 | Cuk | |
| 6,342,822 B1 | 1/2002 | So | |
| 6,346,743 B1 | 2/2002 | Figueroa | |
| 6,366,070 B1 | 4/2002 | Cooke et al. | |
| 6,377,032 B1 | 4/2002 | Andruzzi et al. | |
| 6,381,159 B2 | 4/2002 | Oknaian et al. | |
| 6,388,896 B1 | 5/2002 | Cuk | |
| 6,445,233 B1 | 9/2002 | Pinai et al. | |
| 6,462,962 B1 | 10/2002 | Cuk | |
| 6,583,610 B2 | 6/2003 | Groom | |
| 6,642,698 B2 | 11/2003 | Pohlman | |
| 6,713,995 B2 | 3/2004 | Chen | |
| 6,714,426 B1 | 3/2004 | Guo et al. | |
| 6,737,843 B2 | 5/2004 | Kanakubo et al. | |
| 6,784,644 B2 | 8/2004 | Xu et al. | |
| 6,803,750 B2 | 10/2004 | Zhang | |
| 6,815,936 B2 | 11/2004 | Wiktor et al. | |
| 6,897,641 B1 | 5/2005 | Herbert | |
| 6,949,916 B2 | 9/2005 | Chapuis | |
| 6,967,429 B2 | 11/2005 | Bachmaier et al. | |
| RE38,940 E | 1/2006 | Isham et al. | |
| 7,000,125 B2 | 2/2006 | Chapuis et al. | |
| 7,002,328 B2 | 2/2006 | Kernahan et al. | |
| 7,019,504 B2 | 3/2006 | Pullen et al. | |
| 7,026,795 B2 | 4/2006 | So | |
| 7,045,992 B1 | 5/2006 | Silva et al. | |
| 7,057,380 B2 | 6/2006 | Kuo et al. | |
| 7,058,373 B2 | 6/2006 | Grigore | |
| 7,102,340 B1 | 9/2006 | Ferguson | |
| 7,135,841 B1 | 11/2006 | Tomiyoshi et al. | |
| 7,148,442 B2 | 12/2006 | Murai et al. | |
| 7,157,889 B2 | 1/2007 | Kernahan | |
| 7,173,403 B1 | 2/2007 | Chen et al. | |
| 7,180,757 B2 | 2/2007 | Chen et al. | |
| 7,196,503 B2 | 3/2007 | Wood et al. | |
| 7,205,821 B2 | 4/2007 | Rutter | |
| 7,230,405 B2 | 6/2007 | Jang et al. | |
| 7,288,924 B2 | 10/2007 | Trandafir et al. | |
| 7,298,122 B2 | 11/2007 | Bernacchia et al. | |
| 7,342,385 B2 | 3/2008 | Capodivacca et al. | |
| 7,372,241 B1 | 5/2008 | Tomiyoshi | |
| 7,391,190 B1 | 6/2008 | Rajagopaian | |
| 7,436,233 B2 | 10/2008 | Yee et al. | |
| 7,439,721 B2 | 10/2008 | Weng et al. | |
| 7,446,513 B2 | 11/2008 | Dikken et al. | |
| 7,474,086 B2 | 1/2009 | Chen et al. | |
| 7,482,791 B2 | 1/2009 | Stoichita et al. | |
| 7,482,795 B2 | 1/2009 | Parto et al. | |
| 7,508,181 B2 | 3/2009 | Chen et al. | |
| 7,554,310 B2 | 6/2009 | Chapuis et al. | |
| 7,567,067 B2 | 7/2009 | Lee et al. | |
| 7,595,624 B2 | 9/2009 | Tateishi et al. | |
| 7,638,987 B2 | 12/2009 | Sugiyama | |
| 7,649,346 B2 | 1/2010 | Sohma | |
| 7,710,084 B1 | 5/2010 | Guo | |
| 7,714,547 B2 | 5/2010 | Fogg et al. | |
| 7,764,057 B2 | 7/2010 | Groom | |
| 7,777,587 B2 | 8/2010 | Stevenson et al. | |
| 7,778,064 B2 | 8/2010 | Parkinson et al. | |
| 7,782,639 B2 | 8/2010 | Vinciarelli | |
| 7,834,606 B2 | 11/2010 | Liu et al. | |
| 7,859,324 B2 | 12/2010 | Yamashita et al. | |
| 7,868,599 B2 | 1/2011 | Rahman et al. | |
| 7,902,803 B2 | 3/2011 | Peng et al. | |
| 7,906,942 B2 | 3/2011 | Sugahara et al. | |
| 7,919,952 B1 | 4/2011 | Fahrenbruch | |
| 7,936,160 B1 | 5/2011 | Sheehan | |
| 7,944,153 B2 | 5/2011 | Greenfeld et al. | |
| 7,986,135 B2 | 7/2011 | Kenly et al. | |
| 8,004,070 B1 | 8/2011 | Chen | |
| 8,022,746 B1 | 9/2011 | Signoretti et al. | |
| 8,040,121 B2 | 10/2011 | Ishida et al. | |
| 8,054,639 B2 | 11/2011 | Hsu | |
| 8,093,878 B2 | 1/2012 | Katsuya et al. | |
| 8,120,345 B2 | 2/2012 | Akiyama et al. | |
| 8,148,815 B2 | 4/2012 | Girdhar et al. | |
| 8,154,268 B2 | 4/2012 | Philbrick et al. | |
| 8,159,263 B1 | 4/2012 | Tuan | |
| 8,164,320 B2 | 4/2012 | Latham et al. | |
| RE43,414 E | 5/2012 | Walters et al. | |
| 8,198,880 B2 | 6/2012 | Ouyang | |
| 8,248,046 B2 | 8/2012 | Hasegawa | |
| 8,253,398 B2 | 8/2012 | Nakamura et al. | |
| 8,278,898 B2 | 10/2012 | Davoudi et al. | |
| 8,283,905 B2 | 10/2012 | Chang et al. | |
| 8,330,435 B2 | 12/2012 | Qiu et al. | |
| 8,344,709 B2 | 1/2013 | Zhang et al. | |
| 8,400,129 B2 | 3/2013 | Ouyang | |
| 8,410,765 B2 | 4/2013 | Hung et al. | |
| 8,427,853 B2 | 4/2013 | Uno | |
| 8,441,235 B2 | 5/2013 | Shi et al. | |
| 8,446,135 B2 | 5/2013 | Chen et al. | |
| 8,450,989 B2 | 5/2013 | Wiktor et al. | |
| 8,476,882 B2 | 7/2013 | Luo et al. | |
| 8,487,599 B2 | 7/2013 | Lee et al. | |
| 8,508,206 B2 | 8/2013 | Wan et al. | |
| 8,524,532 B1 | 9/2013 | Joshi | |
| 8,570,020 B2 | 10/2013 | Tang et al. | |
| 8,575,911 B2 | 11/2013 | Cheng et al. | |
| 8,582,333 B2 | 11/2013 | Oraw et al. | |
| 8,618,779 B2 | 12/2013 | Garrett et al. | |
| 8,629,666 B2 | 1/2014 | Carroll et al. | |
| 8,659,282 B2 | 2/2014 | Chen | |
| 8,676,525 B2 | 3/2014 | Holmberg et al. | |
| 8,679,896 B2 | 3/2014 | Joshi et al. | |
| 8,698,475 B2 | 4/2014 | Dong et al. | |
| 8,717,002 B2 | 5/2014 | Xi | |
| 8,749,216 B2 | 6/2014 | Li et al. | |
| 8,773,090 B2 | 7/2014 | Ouyang et al. | |
| 8,786,267 B2 | 7/2014 | Lu et al. | |
| 8,803,495 B2 | 8/2014 | Nguyen et al. | |

(56) References Cited

U.S. PATENT DOCUMENTS

| | | | |
|---|---|---|---|
| 8,810,294 B2 | 8/2014 | Lynch et al. |
| 8,829,866 B2 | 9/2014 | Lethellier |
| 8,860,387 B2 | 10/2014 | Kobayashi |
| 8,860,396 B2 | 10/2014 | Giuliano |
| 8,890,501 B2 | 11/2014 | Evans et al. |
| 8,901,911 B2 | 12/2014 | Wen et al. |
| 8,912,773 B2 | 12/2014 | Parto et al. |
| 8,941,367 B2 | 1/2015 | Li et al. |
| 8,957,653 B2 | 2/2015 | Yang et al. |
| 8,975,885 B2 | 3/2015 | Philbrick et al. |
| 8,994,346 B2 | 3/2015 | Rahardjo et al. |
| 9,030,177 B2 | 5/2015 | Nakashima |
| 9,035,624 B1 | 5/2015 | Rahimi et al. |
| 9,058,043 B2 | 6/2015 | Lin et al. |
| 9,065,337 B2 | 6/2015 | Tanabe et al. |
| 9,070,642 B2 | 6/2015 | Standing et al. |
| 9,071,125 B2 | 6/2015 | Michishita |
| 9,077,260 B2 | 7/2015 | Zhao et al. |
| 9,088,202 B2 | 7/2015 | Mizutani et al. |
| 9,110,489 B2 | 8/2015 | Svorc |
| 9,190,383 B2 | 11/2015 | Cho et al. |
| 9,214,415 B2 | 12/2015 | Denison et al. |
| 9,231,471 B2 | 1/2016 | Cuk |
| 9,252,661 B2 | 2/2016 | Grbo et al. |
| 9,337,735 B2 | 5/2016 | Odaohhara |
| 9,389,625 B2 | 7/2016 | Hu et al. |
| 9,406,674 B2 | 8/2016 | Briere |
| 9,437,570 B2 | 9/2016 | Cho et al. |
| 9,502,980 B2 | 11/2016 | Rahimi et al. |
| 9,563,263 B2 | 2/2017 | Maiyuran et al. |
| 9,575,096 B2 | 2/2017 | Wang et al. |
| 9,577,522 B2 | 2/2017 | Jayawant et al. |
| 9,584,006 B2 | 2/2017 | McDonald et al. |
| 9,588,532 B2 | 3/2017 | Rahimi et al. |
| 9,653,996 B2 | 5/2017 | Parto et al. |
| 9,711,279 B2 | 7/2017 | Dodorov et al. |
| 9,729,059 B1 | 8/2017 | Parto |
| 9,767,947 B1 | 9/2017 | Ikriannikov |
| 10,193,442 B2 | 1/2019 | Parto |
| 10,234,930 B2 | 3/2019 | Lee et al. |
| 10,504,848 B1 | 12/2019 | Parto |
| 10,924,011 B2 | 2/2021 | Parto |
| 11,063,516 B1 | 7/2021 | Kim et al. |
| 11,069,624 B2 | 7/2021 | Standing |
| 2003/0042880 A1 | 3/2003 | Kataoka |
| 2004/0125618 A1 | 7/2004 | De Rooij et al. |
| 2005/0040796 A1 | 2/2005 | Sutardja |
| 2005/0245001 A1 | 11/2005 | Hyvonen et al. |
| 2005/0280404 A1 | 12/2005 | LeFevre et al. |
| 2006/0220629 A1 | 10/2006 | Saito et al. |
| 2007/0001653 A1 | 1/2007 | Xu |
| 2008/0067666 A1 | 3/2008 | Hsu |
| 2008/0273314 A1 | 11/2008 | Cho et al. |
| 2009/0108908 A1 | 4/2009 | Yamadaya |
| 2010/0001699 A1 | 1/2010 | Dragojevic |
| 2010/0134985 A1 | 6/2010 | Hsu |
| 2011/0058285 A1 | 3/2011 | Wibben |
| 2011/0227546 A1 | 9/2011 | Nishijima et al. |
| 2012/0049826 A1 | 3/2012 | Hsu et al. |
| 2012/0274296 A1 | 11/2012 | Higuchi |
| 2012/0302012 A1 | 11/2012 | Zeng |
| 2013/0074907 A1 | 3/2013 | Saunders |
| 2014/0084884 A1 | 3/2014 | Lee |
| 2014/0159689 A1 | 6/2014 | Chen |
| 2015/0062989 A1 | 3/2015 | Su |
| 2015/0180355 A1 | 6/2015 | Freeman et al. |
| 2015/0311792 A1 | 10/2015 | Amaro et al. |
| 2015/0311797 A1 | 10/2015 | Okamatsu et al. |
| 2016/0118325 A1 | 4/2016 | Wang et al. |
| 2016/0218559 A1 | 7/2016 | Mehas et al. |
| 2017/0231094 A1 | 8/2017 | Blackshear et al. |
| 2018/0183330 A1 | 6/2018 | Assaad et al. |
| 2018/0204665 A1 | 7/2018 | Peng et al. |
| 2019/0379272 A1 | 2/2019 | Carpenter |
| 2020/0075541 A1 | 3/2020 | Sturcken |
| 2020/0350255 A1 | 11/2020 | Parto |
| 2021/0050779 A1 | 2/2021 | Deng |
| 2021/0313881 A1 | 10/2021 | Parto |
| 2022/0068705 A1 | 3/2022 | Kim |
| 2022/0068823 A1 | 3/2022 | Standing |

FOREIGN PATENT DOCUMENTS

| | | |
|---|---|---|
| JP | 2005-143284 | 6/2005 |
| JP | 2006-223088 | 8/2006 |
| JP | 2008-235773 | 10/2008 |
| JP | 4427667 | 3/2010 |
| JP | 2010-129877 | 6/2010 |
| JP | 2010-207068 | 9/2010 |
| JP | 2011-138812 | 7/2011 |
| JP | 2013-062943 | 4/2013 |
| JP | 5433880 | 3/2014 |
| JP | 5474488 | 4/2014 |
| JP | 2015-047017 | 3/2015 |
| JP | 2015-133905 | 7/2015 |
| JP | 2016-503963 | 2/2016 |
| WO | WO 2008/013871 | 1/2008 |
| WO | WO 2010/139358 | 12/2010 |

OTHER PUBLICATIONS

Bryson: "Using auto-zero comparator techniques to improve PWM performance (Part 1 of 2), Jun. 23, 2008." www.eetimes.com.

Bryson: "Using auto-zero comparator techniques to improve PWM performance (Part 2 of 2), Jun. 23, 2008." www.eetimes.com.

Burton, Intel Corp. APEC 2015, Package and Platform View of Intel's Fully Integrated Voltage Regulators (FIVR) (23 pgs).

Enhancement-Mode Gallium Nitride Technology, Efficient Power Conversion, product brief, 2016.

Intel, Dual Intel, Xeon, Processor Voltage Regulator Down (VRD) Design Guidelines, Jul. 2003, 22 pages.

Intel, Voltage Regulator-Down (VRD) 11.0, Processor Power Delivery Design Guidelines For Desktop LGA775 Socket, Nov. 2006 (88 pgs).

Nakanishi, "A two-stage converter with a coupled-inductor," Power Elec & Drive Sys, PEDS (2007) 7th Int'l conf of IEEE, pp. 653-657.

TPS54A20 8-V to 14-V Input, 10-A, up to 10-MHz SWIFT™ Step Down Converter, Texas Instruments, data sheet, Apr. 2016.

TPS8268x 1600-mA High Efficiency MicroSIP™ Step-Down Converter Module, Texas Instruments, data sheet, Oct. 2014.

Jun. 8, 2018 Int'l Search Report & Written Opinion from PCT/US2018/017109 (16 pgs).

Aug. 13, 2019, International Preliminary Report on Patentability from PCT/US2018/017109 (13 pgs).

Sep. 15, 2020, International Search Report and Written Opinion from PCT/US2020/028585 (12 pgs.).

International Search Report and Written Opinion dated Nov. 2, 2021 in application No. PCT/US2021/041453.

Shortt et al., "A 600-W Four-Stage Phase-Shifted-Parallel DC-to-DC Converter", Apr. 1987.

Wei, "Investigation of High-Input-Voltage Non-Isolated Voltage Regulator Modules Topology Candidates", May 7, 2002.

Zhang et al., "Study of the Multilevel Converters in DC-DC Applications", 2004.

Guo, "High Performance Forward Converter in Non-Isolated Configurations", 2003.

ELECTRICAL DEVICES AND METHODS OF MANUFACTURE

CROSS-REFERENCE TO RELATED APPLICATIONS

This application is a divisional of U.S. patent application Ser. No. 16/851,032, filed Apr. 16, 2020, and titled ELECTRICAL DEVICES AND METHODS OF MANUFACTURE, which claims the benefit under 35 U.S.C. § 119(e) of U.S. Provisional Patent Application No. 62/835,357, filed Apr. 17, 2019, and titled ELECTRICAL DEVICES. The entire contents of the above-identified application(s) are hereby incorporated by reference herein and made part of this specification for all that they disclose.

BACKGROUND

Field of the Disclosure

Some embodiments disclosed herein relate to methods for making electrical devices, such as for embedding circuitry, such as into a printed circuit board (PCB), and resulting electrical devices.

Description of the Related Art

Although there are several potential methods of embedding a die or other circuitry into a printed circuit board (PCB), there remains a need for improved techniques for embedding circuitry into a PCB.

SUMMARY

Certain example embodiments are summarized below for illustrative purposes. The embodiments are not limited to the specific implementations recited herein. Embodiments may include several novel features, no single one of which is solely responsible for its desirable attributes or which is essential to the embodiments.

Various embodiments disclosed herein can relate to methods of making an electrical device. The method can include coupling a first frontside conductive layer to a front side of an integrated circuit die. The front side of the integrated circuit die can have one or more frontside contacts. The method can include forming one or more holes through the first frontside conductive layer at one or more locations over the one or more frontside contacts, and applying a conductive material into the one or more holes through the first frontside conductive layer to electrically couple the first frontside conductive layer to the frontside contacts of the integrated circuit die. The method can include forming a circuit pattern in the first frontside conductive layer. The method can include forming one or more conductive raised portions on the frontside conductive layer, applying a second frontside conductive layer over the first frontside conductive layer, with an insulating material between at least portions of the first frontside conductive layer and the second frontside conductive layer. The method can include forming one or more holes through the second frontside conductive layer at one or more locations over the one or more conductive raised portions and applying a conductive material into the one or more holes through the second frontside conductive layer to electrically couple the second frontside conductive layer to the one or more raised formations. The method can include forming a circuit pattern in the second frontside conductive layer.

The method can include applying a backside conductive layer over the back side of the integrated circuit die. The backside conductive layer and the first frontside conductive layer can both extend laterally past an edge of the integrated circuit die. An insulating spacer can be next to the integrated circuit die and between the first frontside conductive layer and the backside conductive layer. The method can include forming one or more holes through the backside conductive layer, through the spacer, and at least to the first frontside conductive layer, and applying a conductive material into the one or more holes to electrically couple the first frontside conductive layer to the backside conductive layer. Applying the conductive material into the one or more holes can include forming one or more barrel plated vias. The method can include forming a circuit pattern in the backside conductive layer.

The method can include applying a first backside conductive layer over a back side of the integrated circuit die. The back side of the integrated circuit die can include one or more backside contacts. The method can include forming one or more holes through the first backside conductive layer at one or more locations over the backside contacts and applying a conductive material into the one or more holes through the first backside conductive layer to electrically couple the first backside conductive layer to the backside contacts of the integrated circuit die. The method can include forming a circuit pattern in the first backside conductive layer. The method can include forming one or more conductive backside raised portions on the backside conductive layer, and applying a second backside conductive layer over the first backside conductive layer, with an insulating material between at least portions of the first backside conductive layer and the second backside conductive layer. The method can include forming one or more holes through the second backside conductive layer at one or more locations over the backside conductive raised portions, and applying a conductive material into the one or more holes through the second backside conductive layer to electrically couple the second backside conductive layer to the backside raised formations. The method can include forming a circuit pattern in the second backside conductive layer.

The second backside conductive layer and the first frontside conductive layer can both extend laterally past an edge of the integrated circuit die. An insulating spacer can be next to the integrated circuit die and between the first frontside conductive layer and the second backside conductive layer. The method can include forming one or more holes through the second backside conductive layer, through the spacer, and at least to the first frontside conductive layer, and applying a conductive material into the one or more holes to electrically couple the first frontside conductive layer to the second backside conductive layer. One or more frontside contacts on the integrated circuit die can be electrically accessible from a portion of the second frontside conductive layer. One or more frontside contacts on the integrated circuit die can be electrically accessible from a portion of the second backside conductive layer. One or more backside contacts on the integrated circuit die can be electrically accessible from a portion of the second frontside conductive layer. One or more backside contacts on the integrated circuit die can be electrically accessible from a portion of the second backside conductive layer. The spacer comprises can be pre-preg. The spacer can include fill and flood material. The integrated circuit die can include a redistribution layer. The integrated circuit die can include a passivation material. The method can include applying filler material to underfill between the integrated circuit die and the first frontside conductive layer, and applying additional filler material to flood the area around the integrated circuit die. Forming the one or more holes through the first frontside conductive layer and forming the circuit pattern in the front frontside conductive layer can be performed by the same etching pass. Forming the one or more holes through the first frontside conductive layer and forming the circuit pattern in the front frontside conductive layer can be performed by different etching passes. The method can include cleaning the holes. The method can include processing a panel of electrical devices and singulating the electrical device from the panel. The method can include coupling passive electrical components on one side of the electrical device, and input or output contact pads can be disposed on another side of the electrical device. The electrical device can be a chip-embedded power converter.

Various embodiments disclosed herein relate to an electrical device made by the any of the methods disclosed herein.

Various embodiments disclosed herein relate to electrical devices. The electrical device can include a die that can have electrical circuitry and one or more contacts on a first side for sending or receiving signals to or from the electrical circuitry. A first conductive layer can be over the first side of the die and can be electrically coupled to the one or more contacts. Insulating gaps in the first conductive layer can provide a first circuit pattern. One or more conductive standoffs can be over the first conductive layer and can be electrically coupled to one or more portions of the first conductive layer. A second conductive layer can be over the one or more conductive standoffs. One or more portions of the second conductive layer can be electrically coupled to the one or more conductive standoffs. Insulating gaps in the second conductive layer can provide a second circuit pattern.

The device can include insulating material between the first conductive layer and the second conductive layer and next to the one or more conductive standoffs. The insulating material can extend into a portion of the area between the second conductive layer and the one or more conductive standoffs. A portion of insulating material can be between the one or more conductive standoffs and the second conductive layer. There can be one or more openings through the portion of insulating material. The one or more openings can include conductive material to electrically couple the one or more conductive standoffs to the second conductive layer. The one or more standoffs can have a first area, and the one or more openings can have a second area that is smaller than the first area. In some embodiments, one of the conductive standoffs can have a first area, and the conductive standoff can be electrically coupled to the second conductive layer at a second area that is smaller than the first area. The one or more conductive standoffs can be plated onto the first conductive layer.

The electrical device can include a third conductive layer over a second side of the die. Insulating gaps in the third conductive layer can provide a third circuit pattern. The first conductive layer and the third conductive layer can both extend laterally past an edge of the die. An insulating spacer can be next to the die and between the first conductive layer and the third conductive layer. One or more holes can extend through the third conductive layer, through the spacer, and at least to the first conductive layer. The one or more holes can include a conductive material to electrically couple the first conductive layer and the third conductive layer. At least one of the one or more contacts on the first side of the die can be electrically accessible from a portion of the third conductive layer on the second side of the die.

The electrical device can include a third conductive layer over a second side of the die and the third conductive layer can be electrically coupled to one or more contacts on the second side of the die. Insulating gaps in the third conductive layer provide a third circuit pattern. One or more additional conductive standoffs can be over the third conductive layer and can be electrically coupled to one or more portions of the third conductive layer. A fourth conductive layer can be over the one or more additional conductive standoffs. One or more portions of the fourth conductive layer can be electrically coupled to the one or more additional conductive standoffs. Insulating gaps in the fourth conductive layer can provide a fourth circuit pattern. Insulating material can be between the third conductive layer and the fourth conductive layer and next to the one or more additional conductive standoffs. An insulating spacer can be next to the die and between the first conductive layer and the fourth conductive layer. The first conductive layer and the fourth conductive layer can both extend laterally past an edge of the die. There can be one or more holes through the fourth conductive layer, through the spacer, and at least to the first conductive layer. The one or more holes can include a conductive material to electrically couple the first conductive layer and the fourth conductive layer.

BRIEF DESCRIPTION OF THE DRAWINGS

Certain embodiments will be discussed in detail with reference to the following figures, wherein like reference numerals refer to similar features throughout. These figures are provided for illustrative purposes and the embodiments are not limited to the specific implementations illustrated in the figures.

DETAILED DESCRIPTION OF CERTAIN EMBODIMENTS

Figure 1:
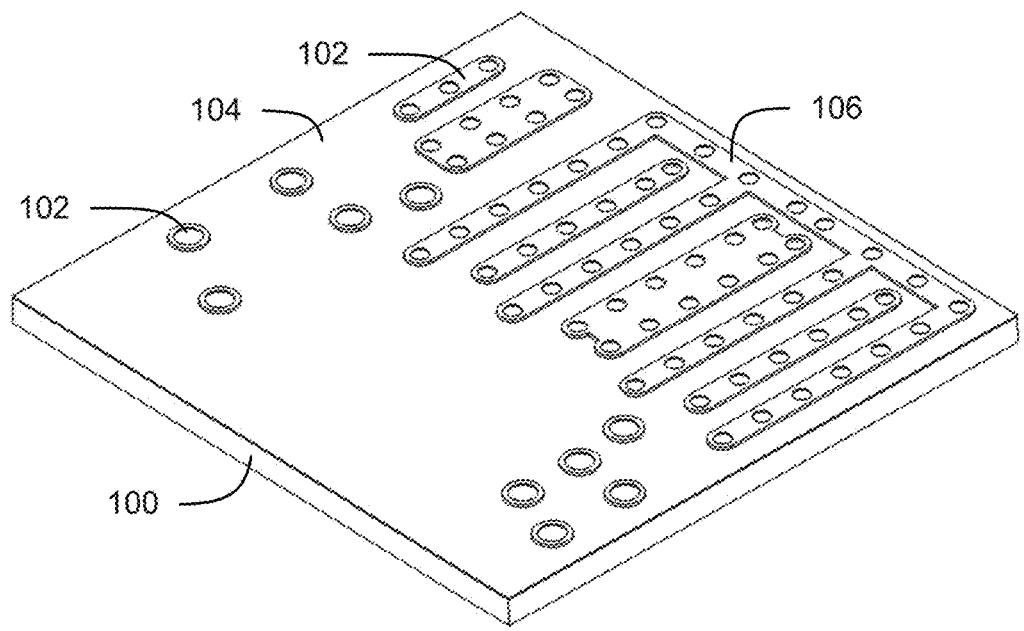
FIG. 1 shows a perspective view of an example embodiment of a die, which can include an integrated circuit (IC) or other circuitry.

There are several potential methods of embedding a die or other circuitry into a printed circuit board (PCB). Various embodiments disclosed herein (e.g., sometimes referenced as "touch technology") can be different from conventional approaches, such as in the connection between the die and the package. In some technologies the die can be embedded in a way such that a relatively thick dielectric layer is present between the layers of the PCB. The layers can then be connected by vias, which can be drilled and plated between these layers. In some cases, the vias can be laser drilled micro-vias. In some embodiments, micro-vias are not used. Some embodiments disclosed herein can use existing profiles or can use created raised profiles to contact or come in near proximity to the conductive material (e.g., copper foil) of the next layer.

Using touch technology, it is possible to avoid or at least reduce drilling processing. This can make the manufacturing process simpler and potentially cheaper. It can also have a benefit in performance with larger cross-section connections between layers. This improvement in connection area can result in lower parasitic losses in the electrical connections and/or better thermal performance. The connection between a die RDL (Redistribution Layer) and the other inner layers can be designed and finished in a way that allows them to actually touch the layer above them. Although in some cases this does not actually result in a good electrical connection, it can mean that the distance between the layers is extremely small, which can remove the need to bore down to each layer, and can allow a via to be created by etching a hole in the conductive material (e.g., copper) above the required connection, for example. In some implementations, there can be one more places that requires vias created with a drilling process, such as where the connection needs to span the die thickness. Embodiments disclosed herein can reduce the drilling operations, which can be a sequential process rather than a batch process, and can be a big benefit for production speed and cost.

Production can be carried out in a panel format. An example format for PCB production is 600 mm×600 mm and a panel of this size can be considered for production of this technology, although various different sizes and production techniques can be used. The panel can be broken into smaller sub-panel sizes within the panel, such as to allow for more accurate processing within that sector of the panel. Various drawings herein are shown at the device level to allow enough illustrated detail, although during processing it can be processed in a panel. In some drawings, a panel or partial panel (e.g., a small 23 mm×23 mm panel section) is shown, while a full-size production panel could be much larger or smaller. The panel can be broken into smaller areas for alignment purposes, e.g., perhaps 100 mm×100 mm, and alignment marks can be applied that may be referenced throughout the build.

Various different designs can be used, such as having different numbers of layers (e.g., 3 layers or 4 layers or other numbers of layers). For example, a 3 layer version can be used for devices where only one side of the device is connected, such as a monolithic integrated circuit (IC) device, or lateral power devices, or a gallium nitride (GaN) device, or an enhanced gallium nitride (eGaN) device. A 4 layer version can be used for devices where both sides of the die are connected. For example, a 4 layer version can be a discrete vertical device such as a power MOSFET or multi-die products, where dies can be mounted facing opposite directions from each other. In some cases, a conductive material can couple to a back side of the die (e.g., using a 4 layer design) to increase thermal conductivity, which can facilitate cooling of the die or other circuitry. The backside contacts can be used to send or receive signals or power, etc. similar to the frontside contacts. Various other designs are possible.

Example 4 Layer Design

Figure 2:
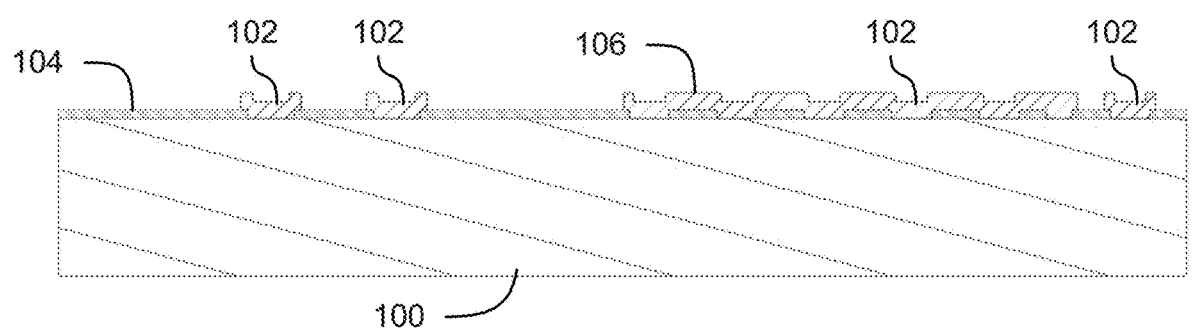
FIG. 2 is a cross-sectional view of an example embodiment of a die.

FIG. 1 shows a perspective view of an example embodiment of a die 100, which can include an integrated circuit (IC) or other circuitry. FIG. 2 is a cross-sectional view of the die 100. The die 100 can include silicon or other semiconductor components, for example. The die 100 can include contacts 102, which can provide inputs to the IC or circuitry of the die 100 or can provide outputs from the IC or circuitry of the die 100. In some embodiments, a passivation layer 104 or material can be applied to one side of the die 100, to both sides of the die 100, or any other suitable portions of the die 100. An organic passivation system or layer 104 can be used, such as polyimide. An RDL (Redistribution Layer) 106 can include copper, although other suitable conductive materials could be used. In some embodiments, portions of the RDL 106 can sit over portions of the passivation layer 104. The RDL 106 can have dips (e.g., 5 µm dips, although other sizes can be used depending on the thickness of the polyimide or other passivation layer). The copper of the RDL 106 can have dips, for example as a result of the passivation layer 104 (e.g., polyimide). For example, the polyimide or other passivation layer 104 can be about 5 µm thick, although other thickness and other configurations are possible (e.g., about 2 µm to about 10 µm). The RDL 106 can align with holes in the passivation layer 104, so that an inner portion of the RDL 106 is in the passivation layer hole (e.g., in direct contact with the die 100), and an outer portion of the RDL 106 is over the passivation material 104. The RDL 106 can be the highest surface(s) of the die 100. The RDL 106 can be flat or with the dips due to the copper forming over the openings in the passivation layer 104 (e.g., polyimide). The RDL 106 can cover discrete portions, and can form the contacts 102 for the die 100, in some embodiments. In some cases, multiple contacts 102 can be electrically coupled, such as by joining RDL material. Multiple contacts 102 an be electrically isolated so that independent electrical signals can be delivered to or from the isolated contacts 102. Various types of dies 100 can be used, which in some cases do not include the passivation layer 104 or the RDL 106.

Figure 3:
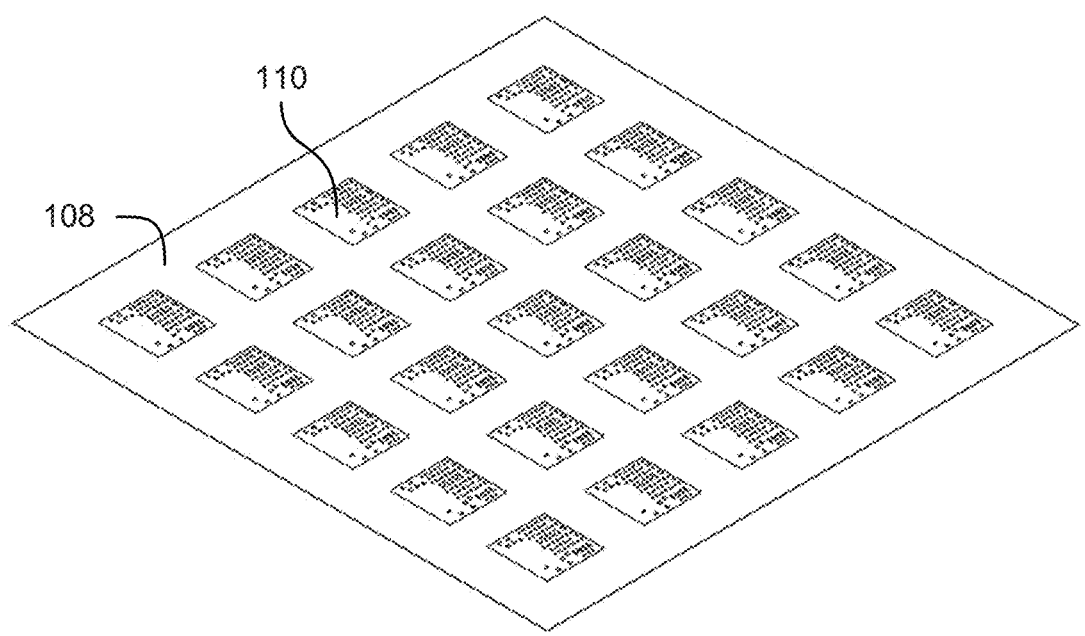
FIG. 3 shows the conductive layer with glue applied thereto.

A conductive layer 108 can be applied to the die 100, such as on a front side, or over the RDL 106. For example, a conductive (e.g., copper) foil 108 can be printed with a glue 110. FIG. 3 shows the conductive layer 108 with glue 110 applied thereto. The foil 108 can be very thin, such as having a thickness of about 15 µm, or about 10-40 µm, or about 5-60 µm, although other thicknesses could be used. The glue 110 can have a pattern of apertures that can align with or match the contact 102 (e.g., the RDL portions 106), or to align with the vias that can be etched down to the RDL 106 or other die contacts at a later stage. The glue 110 may be a standard thermal curing epoxy, or any other suitable adhesive. A glue material containing a UV acrylate system can allow the material to be processed with photoimaging technology, which can result in better aperture control and accuracy, as compared to some embodiments that use other types of glue. Another option may be to use a drop-on-demand (e.g., inkjet) technique or device. The material for a jetting type process can be an acrylate based system (e.g., which can allow low viscosities such as with 100% solids). The glue material 110 can benefit from being very thin and can have a thickness in the range of about 10-15 µm, or about 5-30 µm after drying or stage curing, although other thicknesses and other configurations are possible. Regarding stage curing, drop on demand acrylates can be partially cured after depositing, such as using UV light (fixing). The levels, types and UV power can cure the material from a low level to a fully cured state.

Figure 4:
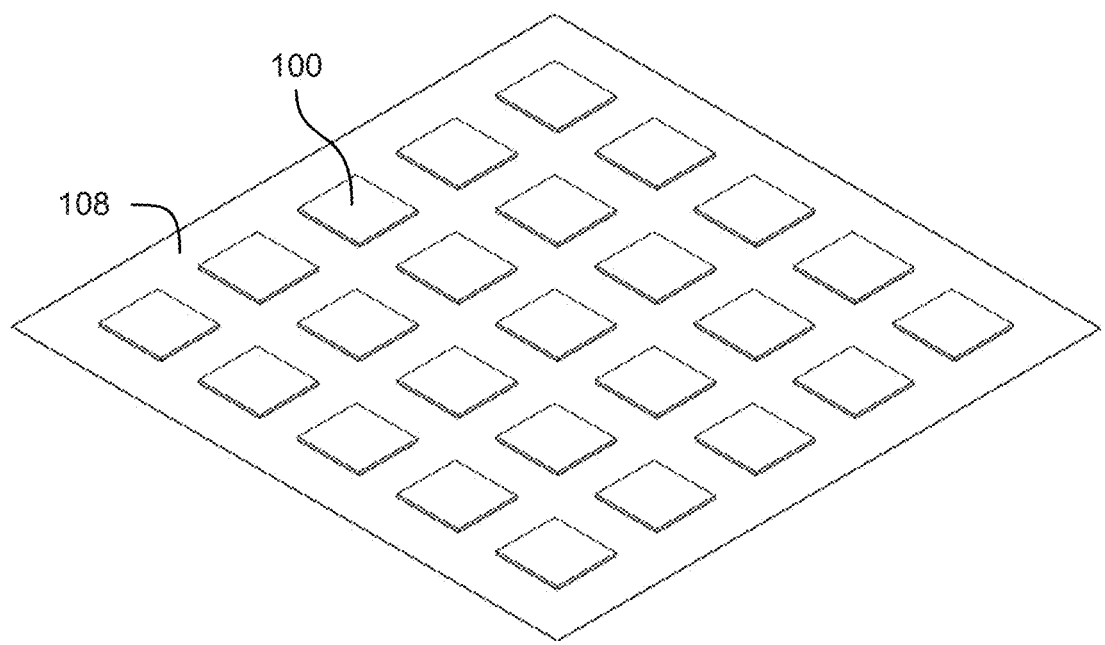
FIG. 4 shows multiple dies placed face down onto glue on a conductive layer.
Figure 5:
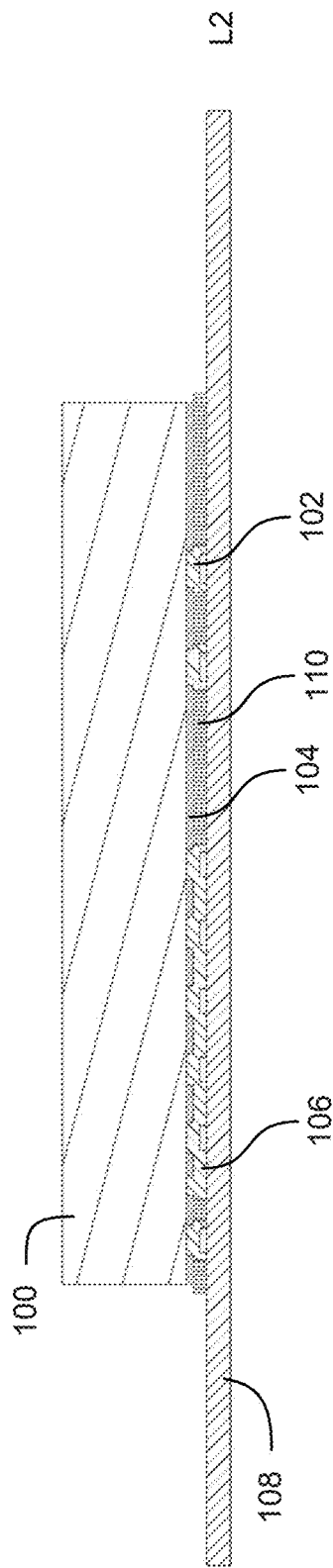
FIG. 5 shows a cross-sectional view of an example embodiment of a die attached to a conductive layer for form a partially manufactured assembly.

The dies 100 can be placed face down onto the glue 110, as shown in FIG. 4, for example. FIGS. 3 and 4 show multiple dies 100 being processed together, and the dies 100 can be processed individually or in larger or smaller groups, as discussed. This can be carried out with accuracy of +/−10 µm or +/−5 µm, for example, to align the die RDL 106 or other die contacts 102 well to the glue pattern 110 on the foil 108. The glue 110 can be engineered so that it is tacky during die bond. It could be that this would utilize a little heat during die-bonding to soften the glue 110. The dies 100 can be pressed down into the glue 110 until the RDL contacts the conductive layer 108 (e.g., copper foil). The glue 110 may be cured, either fully or partially. The glue 110 can be partially cured to a level that allows the die 100 to be stuck to the surface. The cure can later be completed with a thermal cycle. The conductive layer (e.g., copper foil) can form layer 2 (L2). FIG. 5 shows the die 100 attached to the conductive layer 108. In some embodiments, some glue may be forced into the dips in the RDL 106. The RDL 106 or other contact 102 of the die 100 can contact the conductive layer 108 (e.g., copper foil). The glue 110 can be in the cavities between the RDL portions 106 or other contacts 102.

Figure 6:
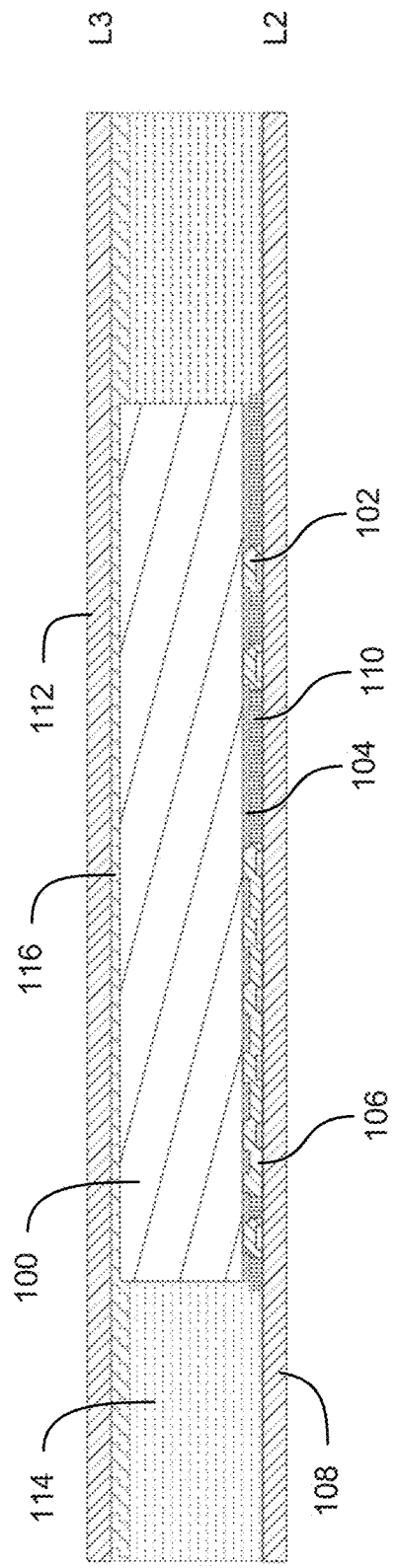
FIG. 6 shows a cross-sectional view of an example embodiment of an assembly with two conductive layers.

With reference to FIG. 6, a second conductive layer 112 (e.g., copper foil) can be laminated onto a back side of the die 100. In FIG. 6, the front side of the device (e.g., with the first conductive layer 108) is facing downward, and the back side of the device (e.g., with the second conductive layer 112) is facing upward. In some embodiments, the front and back sides can be switched, or labeled alternatively as back and front sides, or first and second sides, respectively. The first conductive layer 108 can be positioned over a front side of the die 100 (e.g., below the die 100 in FIG. 6), and the second conductive layer 112 can be positioned over a back side of the die 100 (e.g., above the die 100 in FIG. 6). A first lamination stage can laminate the conductive layer 112 (e.g., layer 3 (L3)) onto the back side of the assembly. A spacer 114 (e.g., one or more pre-pregs) can be used around the die area (e.g., the core of the lamination). The pre-pregs 114 can have glass reinforcement and/or can form a stable core for the assembly. A single or multiple pre-pregs 114 can be machined or otherwise formed to fit around the die 100. Other types of filler material can be used for the spacer 114, in other embodiments. Layer 3 can be coupled to the die by an adhesive 116 (e.g., a layer of filled resin, such as Zetabond). Other adhesives 116, or other attachment mechanisms, can be used to attach the conductive layer 112 to the die 100 (e.g., to the back side of the die 100). The resin layer or other adhesive 116 between the second conductive layer 112 (e.g., layer L3) and the backside of the die 100 can be thin after bonding, which can have beneficial thermal properties. The resin or adhesive layer 116 can have a thickness of about 2 microns, about 4 microns, about 6 microns, 8 microns, about 10 microns, about 12 microns, about 15 microns, about 18 microns, about 20 microns, about 25 microns, or any values or ranges therebetween, although other thicknesses could also be used in some cases. The resin or adhesive layer 116 can have a thickness between about 4 microns and about 10 microns, between about 10 microns and about 15 microns, or between about 15 microns to about 20 microns, for example.

Figure 7:
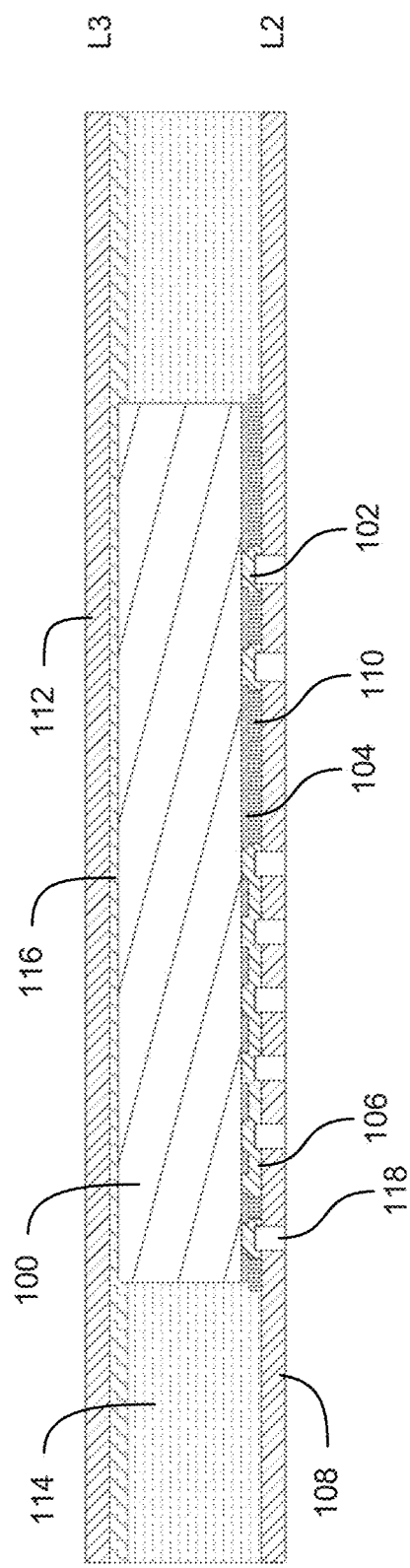
FIG. 7 shows a cross-sectional view of an example embodiment of an assembly with holes formed in a front conductive layer.
Figure 10:
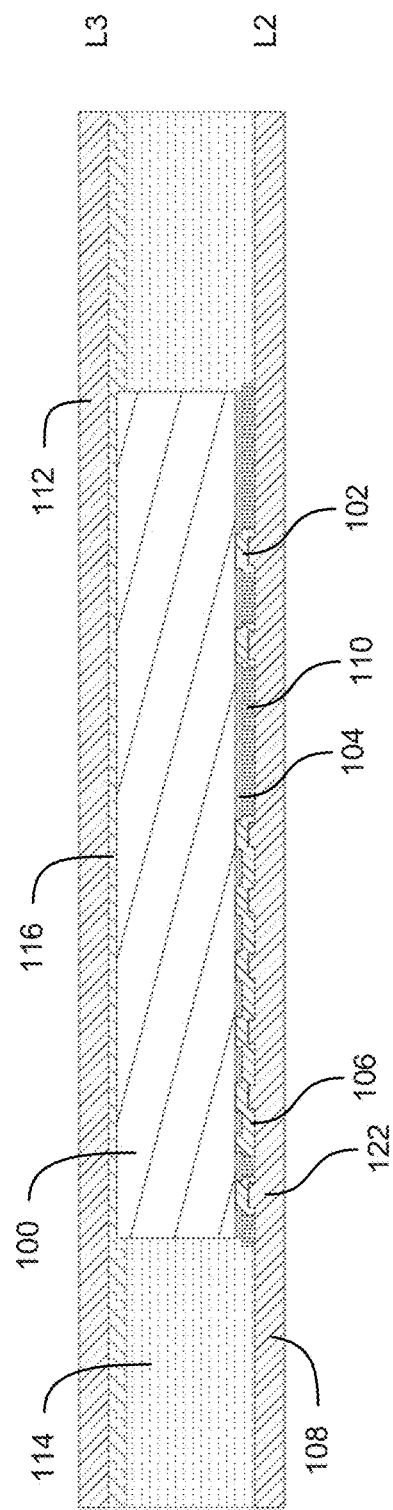
FIG. 10 shows a cross-sectional view of another example embodiment of an assembly with holes filled to provide electrical connection to the die.

With reference to FIG. 7, openings 118 in the front conductive layer 108 (e.g., copper foil L2) can be formed to expose portions of the die 100 or RDL 106 or the contacts 102, such as by etching. An etch resist can be applied, and an etching material can be used to etch the designated areas. A first etch can open vias to the die surface or RDL or contacts. This first etch process can be separated from etching the pattern (e.g., at a later, second etching step, such as shown in FIG. 10) so that the bottoms of the openings 118 can be more aggressively cleaned. Alternatively, in some embodiments, the vias or openings 118 and pattern (e.g., discussed in connection with FIG. 10) can be performed by the same etching process. The residual resin between the first conductive layer 108 and the copper RDL 106 or contacts 102 can be cleaned with laser, plasma, or wet chemical procedures, or combinations of these technologies, or any other suitable cleaning technique. In some cases, the glue 110 can cover the RDL conductive material 106 or contacts 102 (e.g., the holes in the glue 110 that align with the RDL portions 106 can be omitted). The glue 110 can stop the etching process so that the contacts 102 (e.g., RDL material 106) is not etched away. The glue can then be cleaned away or otherwise removed, as discussed herein, to expose the underlying contacts 102 (e.g., RDL material 106). The openings 118 can provide holes or vias to the die 100.

Figure 8:
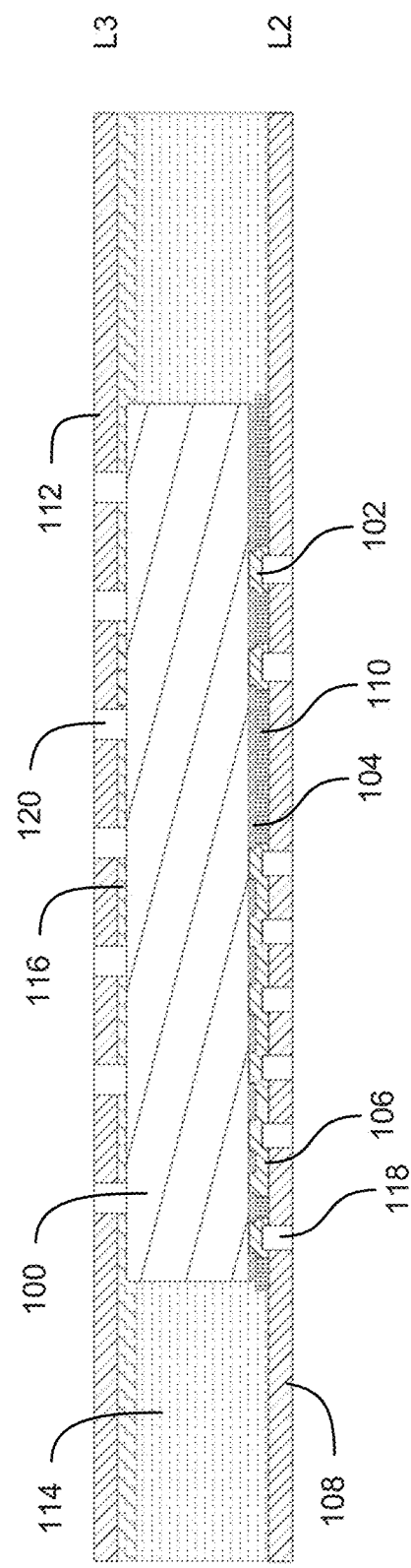
FIG. 8 shows a cross-sectional view of an example embodiment of an assembly with holes formed in a back conductive layer.

In some embodiments, vias can be formed on both the front and back sides. As shown in FIG. 8, openings 120 in the back conductive layer 112 (e.g., copper foil L3) can be formed to expose portions of the die 100 (e.g., back side contacts), for example similar to the front side. In the case that the die 100 has backside metallization or multiple die are packaged together (e.g., in a back-to-back configuration), backside contacts can also be produced during an etching process that is similar to the etching process discussed for forming the openings 118 in the conductive layer 108 (layer 2—L2). Cleaning techniques can be applied similar to the front side. The resin or adhesive 116, or filler material between the die 100 and the conductive layer 112 (L3) can stop the etching process, and the resin or adhesive 116, or filler material can then be removed, such as to expose the underlying contacts on the die 100. In some cases, the openings 120 or vias on the back side can be omitted.

Figure 9:
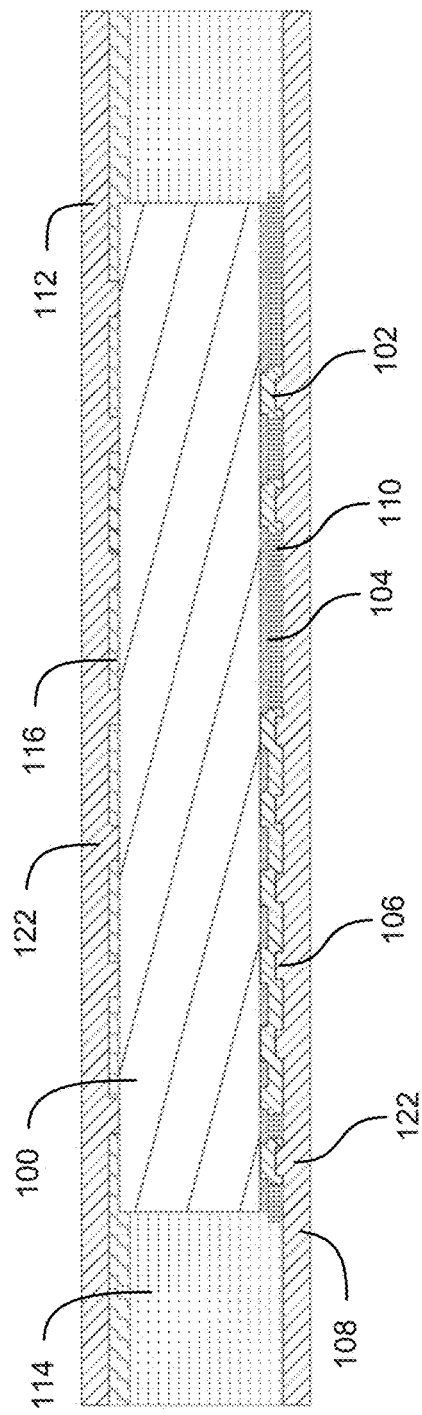
FIG. 9 shows a cross-sectional view of an example embodiment of an assembly with holes filled to provide electrical connection to the die.

The vias can be plated, or otherwise filled with a conductive material 122, which can be the same material as the conductive layer 108 and/or the conductive layer 112 (e.g., copper), although other conductive materials could be used. This can provide a reliable electrical connection between the front conductive layer 108 and/or the back conductive layer 112 (e.g., copper foil L2 and/or L3) and the die 100 (e.g., to the contacts 102 or RDL 106). Vias or openings 118, 120 on the both the front and back can be filled with the conductive material, as shown in FIG. 9.

In some embodiments the vias or openings 120 on the back side can be omitted. For example, FIG. 10 shows the vias or openings 118 on the front side filled (e.g., plated) with the conductive material 122, where no filing or plating is performed on the back side because no openings 120 were formed in the conductive layer 112 on the back side in the embodiment of FIG. 10. Various figures herein show embodiments in which the backside vias or openings 120 are omitted. Although not shown, in some instances, the illustrated embodiments can include backside vias or openings 120 like those shown in FIG. 8, which can be filled as shown in FIG. 9 to provide electrical connection to the back of the die 100.

Figure 11:
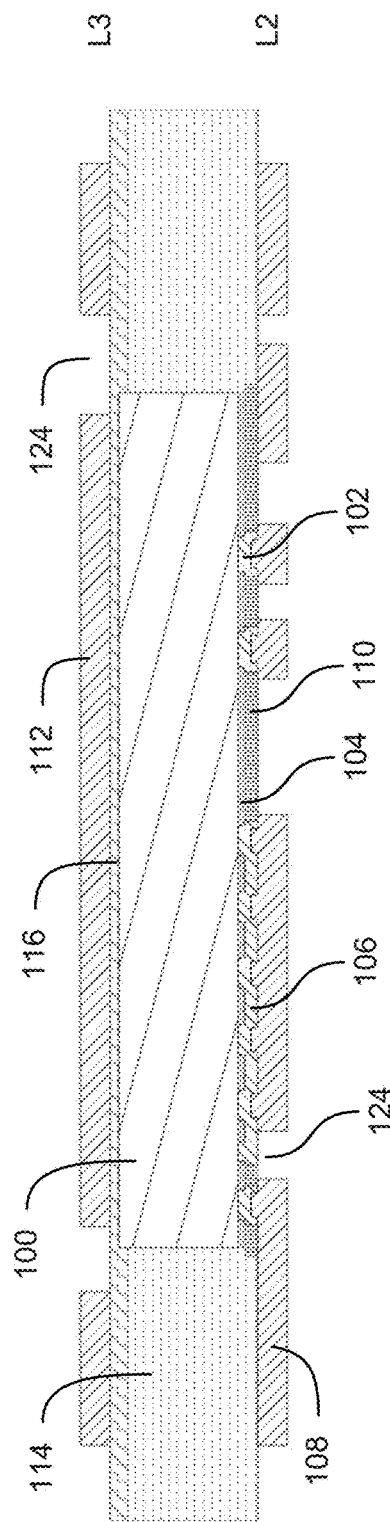
FIG. 11 shows a cross-sectional view of an example embodiment of an assembly with a circuit pattern.
Figure 12:
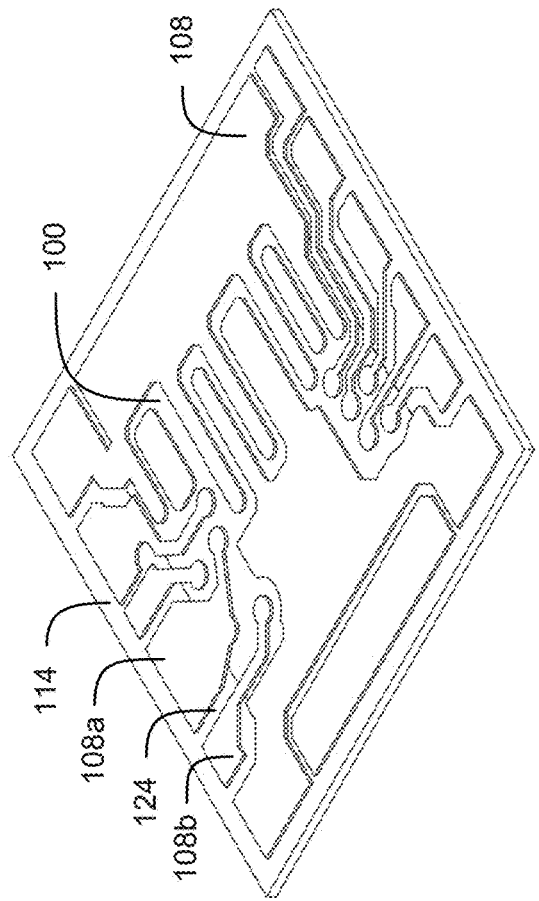
FIG. 12 shows a perspective view of an example embodiment of an assembly with a circuit pattern formed in a front conductive layer.

With reference to FIGS. 11 and 12, a circuit pattern can be etched for the front and/or back conductive layers 108, 112 (e.g., copper foil layers L2 and L3). FIG. 12 shows the circuit pattern formed in the front conductive layer 108 (L2). Material of the front and/or back conductive layers 108, 112 can be removed (e.g., by etching) to form gaps 124, which can separate portions of the front and/or back conductive layers 108, 112. By way of example, FIG. 12 shows that a gap 124 separates a first portion of the conductive material 108a from a second portion of the conductive material 108b. Different signals can be delivered through the first and second portions of the conductive material 108a and 108b. Similar gaps 124 can be formed in the conductive layer 112, such as to form discrete portions of the conductive material of the conductive layer 112. In the cross-section shown in FIG. 11, the vias formed on the back conductive layer 112 (e.g., copper foil L3) can be interconnected by the conductive material (e.g., copper foil L3, so that the same signal would be applied to all the die contacts in this cross-section. In other embodiments or at other cross-sections, a circuit pattern can be applied to L3 that separates the etched vias so that different signals can be delivered to different contacts on the back of the die. The circuit patterns can be etched, such as using an etch resist to set the pattern, or any other suitable technique can be used to form the circuit pattern(s).

Figure 13:
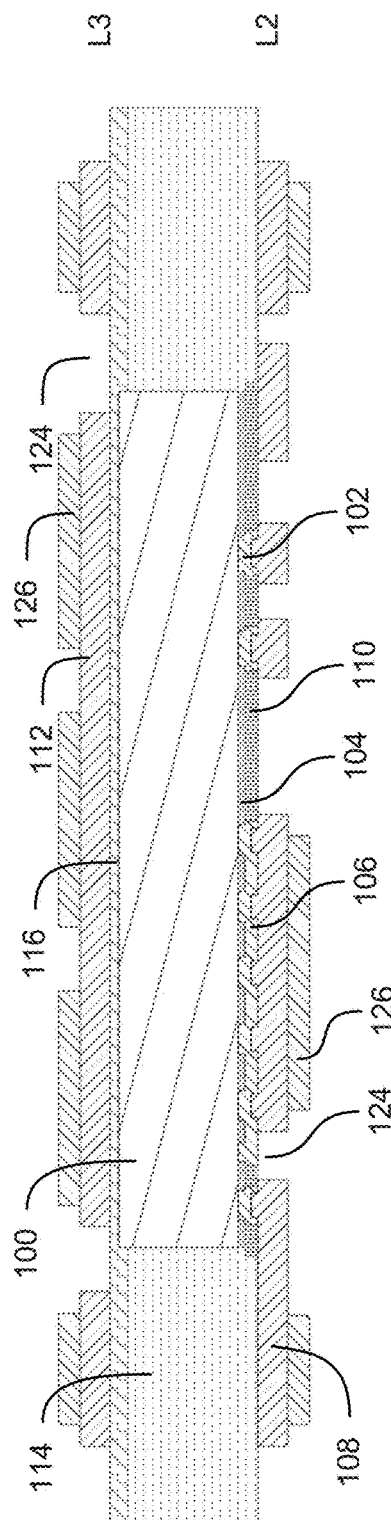
FIG. 13 shows a cross-sectional view of an example embodiment of an assembly with conductive raised portions formed on portions of the conductive circuit pattern.
Figure 14:
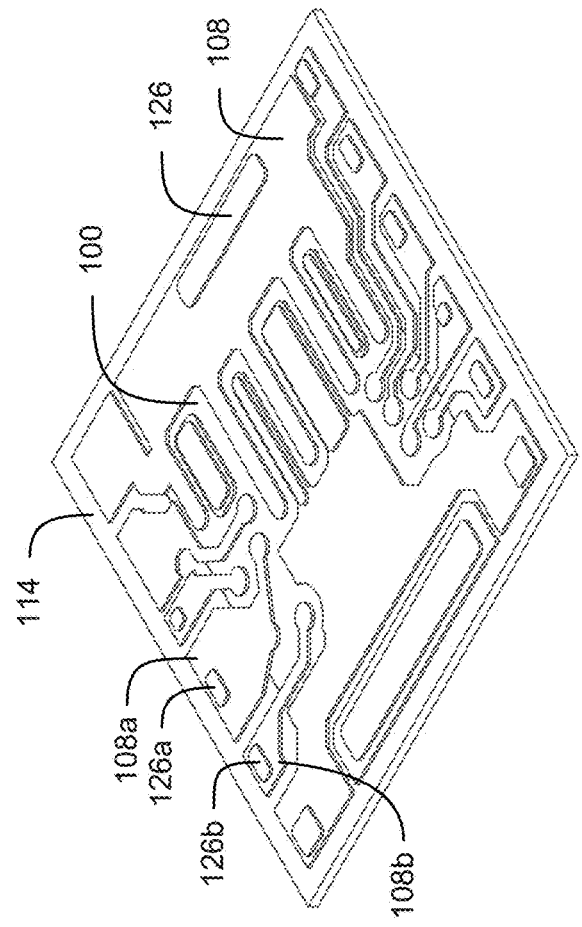
FIG. 14 shows a perspective view of an example embodiment of an assembly with conductive raised portions formed on portions of the conductive circuit pattern.

With reference to FIGS. 13 and 14, raised portions 126 or standoffs can be plated onto portions of the front and/or back conductive layers 108, 112 (layers L2 and/or L3). The raised portions 126 can have a thickness of about 15 μm, or about 10-20 μm, or about 5-30 μm, although other thicknesses could be used. The process can use pattern plating. A plating resist can be applied and the copper, or other conductive material, can be plated up in the designated areas. Different portions of the conductive material can have different raised portions 126. For example, in FIG. 14, a first portion of the conductive material 108a can have a first raised portion 126a, and a second portion of the conductive material 108b can have a second raised portion 126b. The first portion of the conductive material 108a and the first raised portion 126a can be separated (e.g., electrically isolated) from the second portion of the conductive material 108b and the second raised portion 126b, so that different electrical signals can be delivered therethrough. In some cases, a continuous portion of the conductive material 108 or 112 can have multiple raised portions 126. An electrical signal can enter through a first raised portion, transfer along the portion of the conductive material 108 or 112, and exit through a second raised portion, in some instances.

Figure 15:
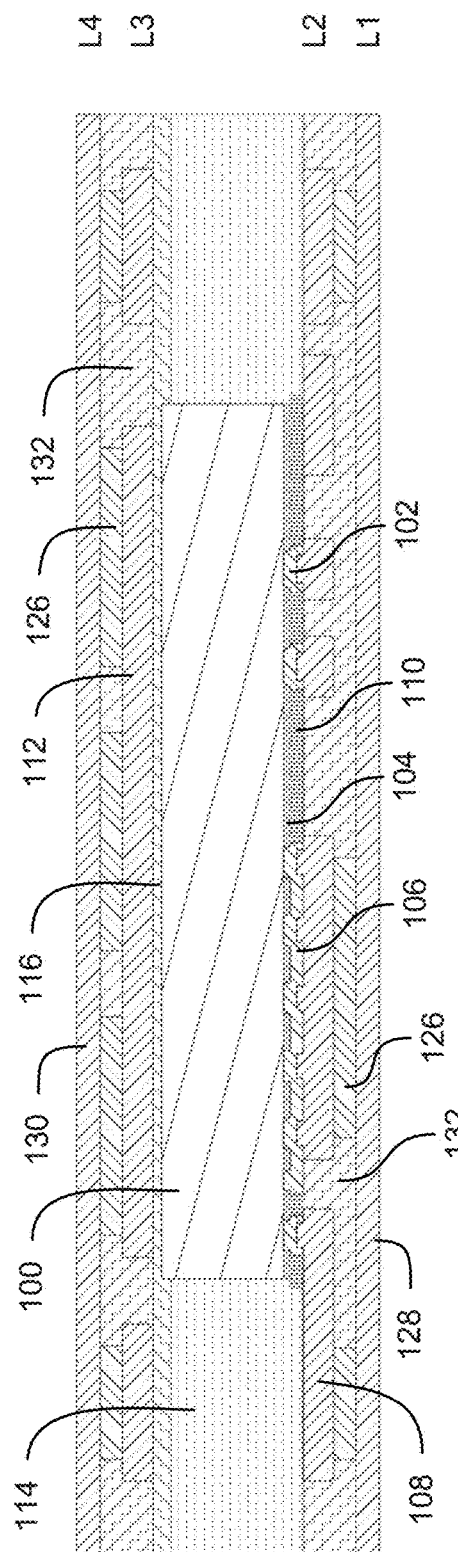
FIG. 15 shows a cross-sectional view of an example embodiment of an assembly with additional front and back conductive layers applied thereto.

With reference to FIG. 15, conductive layers L1 and L4 can be laminated or otherwise coupled onto the assembly. An additional conductive layer 128 (e.g., layer 1) can be applied to the front of the assembly. An additional conductive layer 130 (e.g., layer 4) can be applied to the back of the assembly. Between the outer conductive layers 128 and 130 and the respective inner conductive layers 108 and 112, a filler material 132 (e.g., an adhesive or filled resin) can be used. The resin or other filler material 132 can be electrically insulating. During a press cycle the material can be squeezed out from between the raised portions 126 and the respective conductive layer 128 or 130. The result can be that the raised portions 126 can be very close to being in contact, or in contact, with the outer conductive layers 128 and 130, which can be foils (e.g., conductive layers L1 and L4). The filler material 132 can fill the gaps 124 in the conductive materials 108 and/or 112 to electrically insulate different portions of the circuit pattern.

Figure 16:
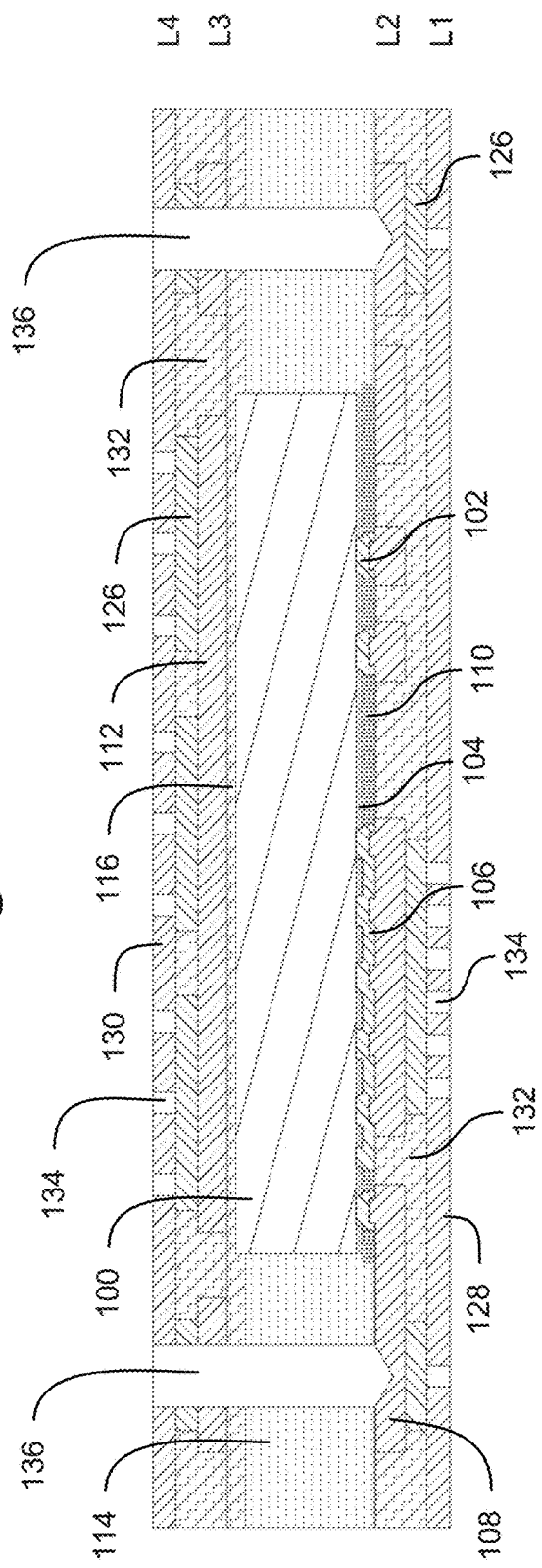
FIG. 16 shows a cross-sectional view of an example embodiment of an assembly with holes formed in the additional front and back conductive layers.

With reference to FIG. 16, similar to the discussion regarding layer L2, openings 134 or vias can be formed (e.g., etched) in the material (e.g., copper) of the conductive layer 128 (L1) and/or the conductive layer 130 (L4), and in some cases residual resin can be cleaned away. As shown in FIG. 16, contact holes 136 can be formed (e.g., mechanically drilled or laser drilled, etc.) from the conductive layer 130 (layer L4) through to the conductive layer 108 (layer L2). The one or more contact holes 136 can extend through the conductive layer 130, through a raised portion 126 on the conductive layer 112, through a portion of the conductive layer 112, through the filler or adhesive 116, through the spacer 114, and into conductive layer 108. In some embodiments, the contact opening 136 does not go through the full thickness of the conductive layer 108, although in some cases, the contact opening could extend further, for example, so that the contact opening extends through the conductive layer 108 (e.g., and into a raised portion 126 that is formed over the conductive layer 108). Across a device or panel, the connections from the conductive layer 130 (layer L4) to the conductive layers 108 and/or 128 (layers L2 and/or L1) can all be created using this method.

Figure 17:
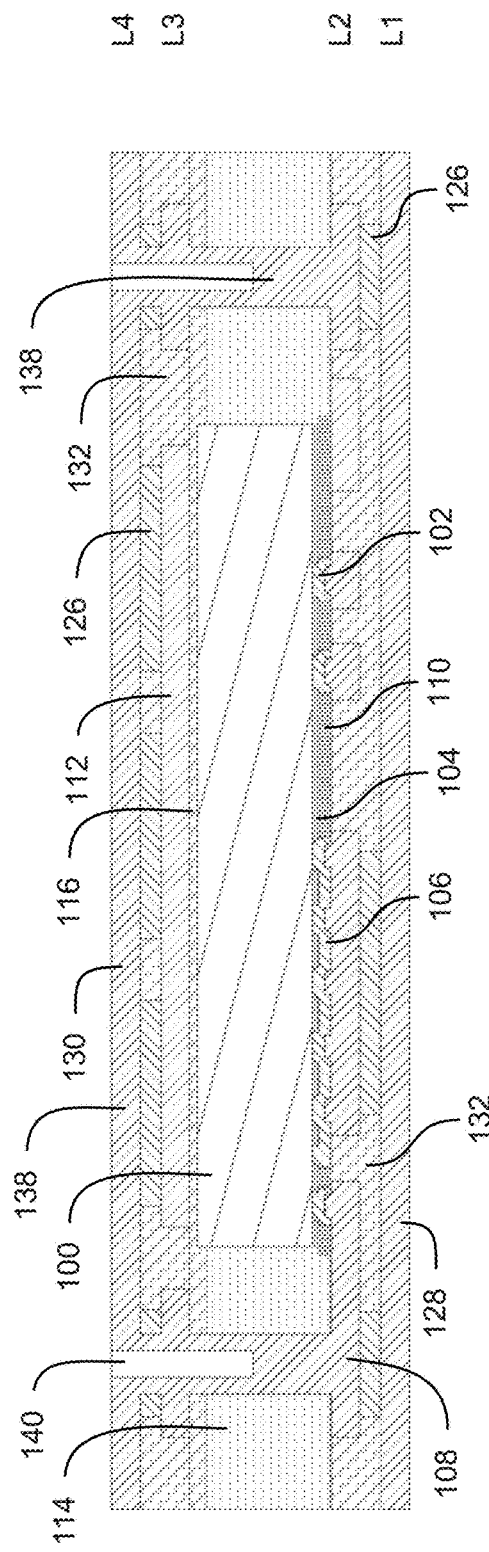
FIG. 17 shows a cross-sectional view of an example embodiment of an assembly with the holes filled with conductive material.

With reference to FIG. 17, similar to the discussion relating to the conductive layer 308 (L2), the openings 134 or vias formed in the conductive layers 128 and/or 130 (L1 and/or L4) can be filled (e.g., plated in), such as with a conductive material 138 (e.g., the same conductive material as the corresponding layer 128 and/or 130). The conductive layers 128 and/or 130 can be electrically coupled to the respective underlying raised portions 126, which can be electrically coupled to the underlying conductive layers 108 and/or 112. The blind vias or contact holes 136 (e.g., extending from layer L4 to layer L2) can be longer than the etched openings 134 or vias, and/or can have a larger diameter than the etched openings 134 or vias. The contact openings 136 or blind vias can be at least partially filled with the conductive material 138, so that the portions of the conductive layer 130 are electrical coupled to corresponding portions of the conductive layer 108. The contact openings 136 can be fully filled, in some embodiments. In some cases, the contact openings 136 or blind vias from layer L4 to layer L2 do not fill completely, which can leave a recess 140 (as shown in FIG. 17). The unfilled vias do not present any problems, in some implementations. In relation to the package, these can be on the top surface, and so present no problems for soldering processes.

Figure 18:
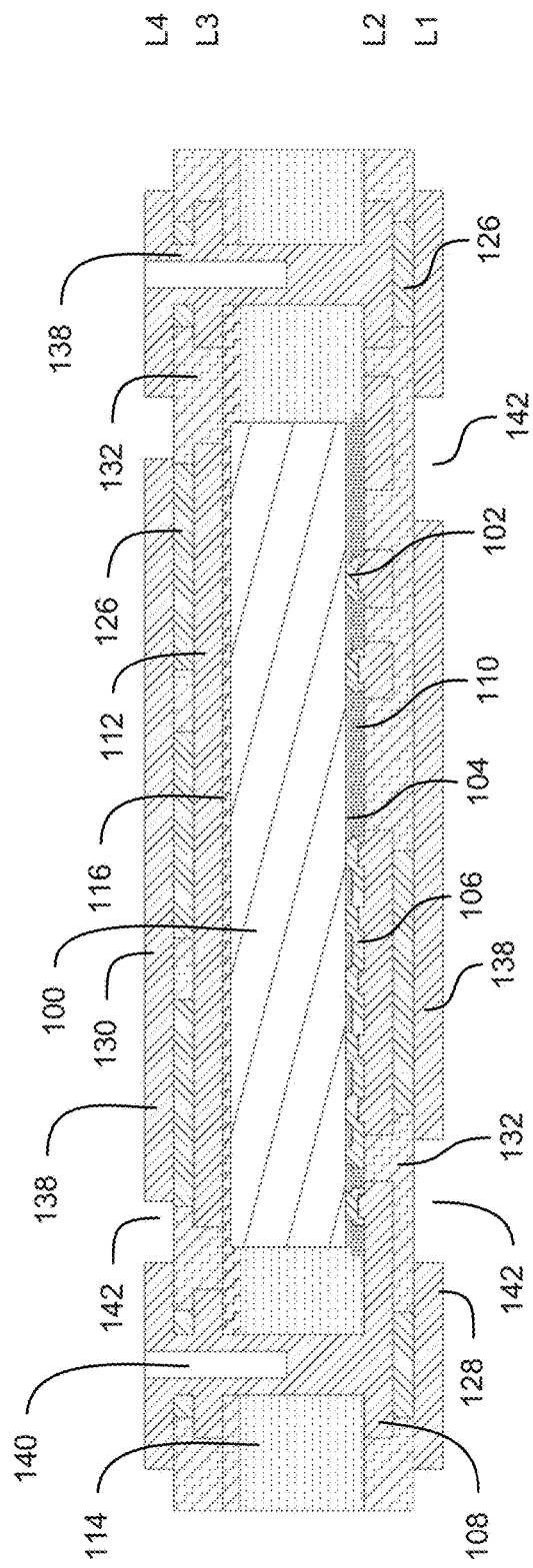
FIG. 18 shows a cross-sectional view of an example embodiment of an assembly with a conductive pattern or contact portions formed in the outer conductive layers.

With reference to FIG. 18, the final (or an additional) etch for the conductive layer 130 (layer L1) and/or conductive layer 128 (layer L4) can be carried out. Conductive layers 128 and/or 130 (layers L1 and/or L4) can be etched to form a pattern or to form isolated contact areas that can receive or output different signals. Gaps 142 can separate portions of the conductive layers 128 and/or 130 to form the pattern or isolated contact areas. A surface finish can be applied, such as electroless nickel immersion gold (ENiG), for example. The substrate can be complete and can be assembled (e.g., passive electrical components mounted if applicable) and/or singulated.

Many variations and alternative feature or techniques can be used. In some cases, the passivation layer 104 and/or the redistribution layer (RDL) 106 on the front of the die 100 can be omitted. The die 100 can include contacts 102, and the conductive materials 108 and/or 112 can couple directly to the die contacts 102 (e.g., on respective front and/or back sides of the die 100), such as described herein for the back side of the die 100. In some cases, a passivation layer 104 and/or RDL 106 can be used on the back side of the die 100 (e.g., similar to the front side as shown). In some cases, the via etching and pattern etching of the conductive layers can be performed together as a single step for each of conductive layers 108, 112, 128, and/or 130 individually. In some cases, the via etching and pattern etching of the conductive layers can be performed together as a single step for conductive layers 108 and 112 together or for conductive layers 128 and 130 together. In some cases, the pattern etching can be performed before or after the via etching, as separate steps.

Example 3 Layer Design

Some embodiments can use a design with three conductive layers. When the die 100 has contacts 102 on only the front side, the conductive layer 112 can be omitted. Die preparation can include applying a passivation layer or material to a die 100 or set of dies. Die preparation can also include applying a redistribution layer (RDL) 106 to the die 100 or set of dies, as discussed herein. The RDL 106 can have dips due to the conductive material (e.g., copper) being formed over the openings in the passivation material 104 (e.g., polyimide). The die 100 shown in FIGS. 1 and/or 2 can be used. The passivation material 104 and RDL 106 can be omitted in some embodiments.

A conductive layer 108 (e.g., copper foil) can be applied to the front side of the die 100, such as using a glue, as discussed herein (e.g., and as shown in FIGS. 3-5). This conductive layer 108 is sometime references as "layer 2" or "L2."

Figure 19:
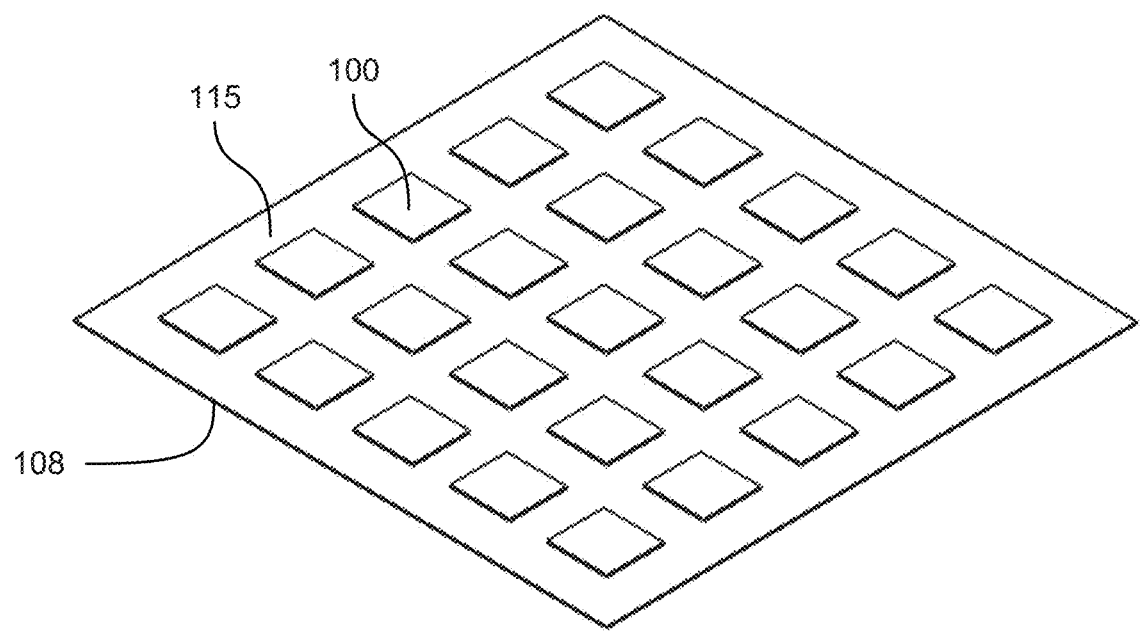
FIG. 19 shows multiple dies placed face down onto a conductive layer and surrounded by a fill material.

The die(s) 100 can be underfilled and flooded, in some embodiments. FIG. 19 shows multiple dies 100 placed face down onto a conductive layer 108, with the flood material 115 surrounding the dies 100. The process can be completed in a single phase, in some embodiments, with the material first being dispensed in a pattern to enable underfilling and then covering the rest of the area and flooding. The underfill material can be an organic polymer, epoxy, or a cyantate ester, although other suitable underfill materials can be used. The flood material can be the same material group as the underfill material, or it can be a different type of material. Epoxy can be used as a flood material, for example. The flood material can have a viscosity that permits it to flow (e.g., at least enough to level). The underfill material and the flood material can have significantly different viscosity and thixotropy properties. The flood material can have a lower viscosity than the underfill material, or the flood material can have a higher viscosity than the underfill material. The flood material can have larger particles size fillers (e.g., silica, talc, $Mg_3Si_4O_{10}(OH)_2$). Many different materials and techniques can be used. Various other types of spacers or fillers can be used. The underfill and flood approach can be used to form the spacer 114 of FIG. 6, for example. In some cases, a pre-preg or other spacer 114 can be used.

Figure 20:
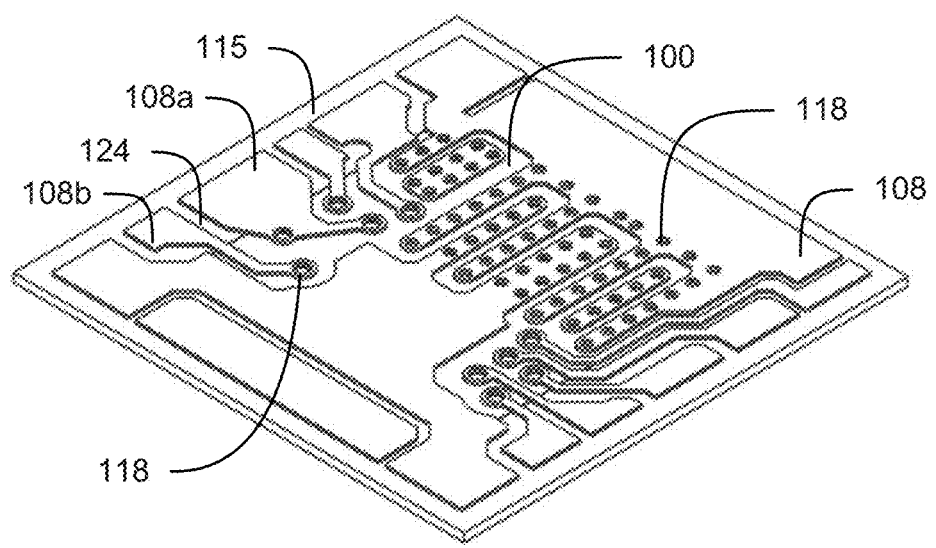
FIG. 20 shows a perspective view of an example embodiment of an assembly where the opening and conductive pattern were formed by the same etching operation.

Vias or openings 118 and circuit patterns can be formed (e.g., etched) in the conductive layer 108 (e.g., copper foil), similar to the discussion of FIGS. 7 and 11-12. The panel can have etch resist applied and the conductive layer 108 (e.g., copper foil L2) can be etched back to open the opening s 118 or vias to the die 100 and to create the L2 metal circuit pattern. The openings 118 or vias may be designed to be larger than the apertures in the glue 110 to allow some inaccuracy in the die placement. The vias/openings 118 and pattern can be formed together with a single etching process, or separately by separate etching processes. In some cases, the vias/openings 118 can be cleaned, and/or glue 100 or resin can be removed from the vias/openings 118, as discussed herein. Various figures herein show a single device for ease of illustration, and it will be understood that several devices can be formed on a panel, as described herein. FIG. 20 shows a front side of the panel with the openings 118 and the gaps 124 to form the conductive pattern formed together by the same etching process. Alternatively, separate etching processes similar to FIGS. 7 and 11 could be used.

The vias/openings 118 can be plated, or otherwise filled with a conductive material 122, which can be the same material as the conductive layer 108 (e.g., copper), although other conductive materials could be used. The panel can be pattern plated to fill the vias/openings 118 to the die 100, which can electrically connect the die 100 (e.g., the contacts 102 or RDL 106 on the die 100) to the patterned circuit of the conductive layer 108. Once the openings 118 are filled, a panel with the front side of FIG. 12 can be produced.

Raised portions 126 or standoffs can be added, which can be used to couple conductive layer 108 (layer L2) to the conductive layer 128 (layer L1), which can be added at a later stage, as discussed herein. The panel can have a second plating process to create small standoffs or raised portions 126 on the conductive layer 108 (layer L2). The raised portions 126 can have a thickness of about 15 μm, or about 10-20 μm, or about 5-30 μm, although other thicknesses could be used. The copper on the next layer 128 can be pushed down to contact (or nearly contact) these raised portions 126 during the lamination process, for example. Zetabond and other material of this type, can be pressed down during lamination to very thin layers (e.g., of just a few microns).

Figure 21:
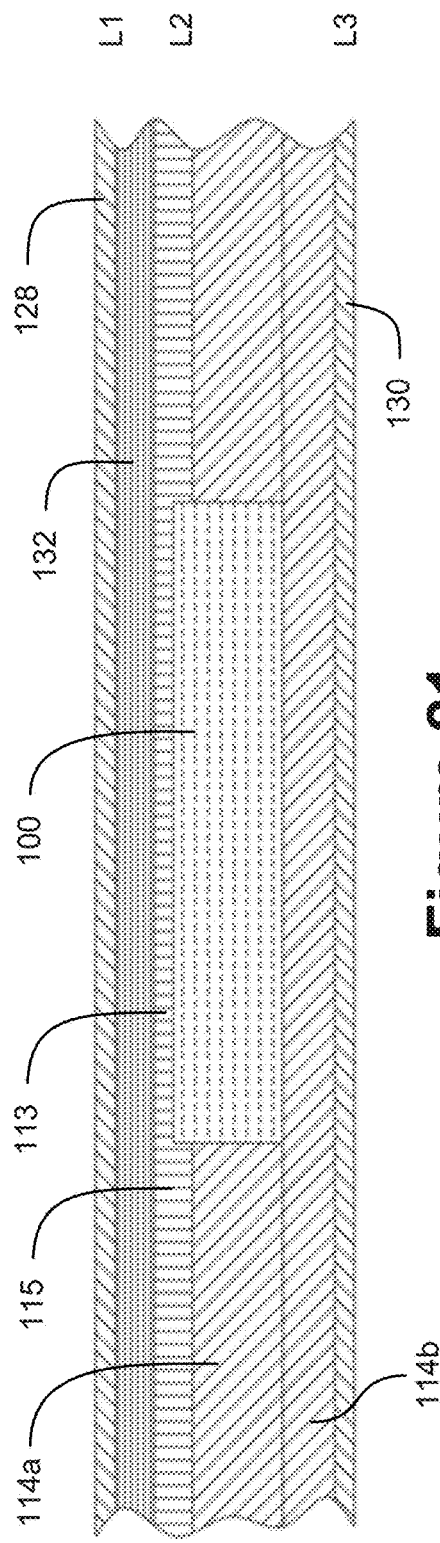
FIG. 21 shows a cross-sectional view of an example embodiment of an assembly with an inner conductive layer and two outer conductive layers.

The panel can be laminated on both sides with conductive layers 128 and 130, for example, similar to FIG. 15. With reference to FIG. 21, on the front side, a filled resin system can be used, such as Zetabond. On the backside, a machined pre-preg 114a with apertures for the die 100 and thin pre-preg 114b between the die 100 and the backside conduct layer 130 (e.g., copper foil) can be used. A pre-preg 114b can be used in this case as the backside of the die 100 does not need to be contacted. In FIG. 21, an outer conductive layer 128 (e.g., a copy foil) can be applied on a front side. In FIG. 21, the front side is facing upward and the back side is facing downward. The outer conductive layer 128 can be referenced as "layer 1" or "L1." A resin, bonding, and/or filler layer 132, such as Zetabond or a similar material, can be used to attach the conductive layer 128. A fill material 113 and a flood material 115 can be used, but can be omitted in some cases. A spacer 114a, such as a pre-preg, such as a machined pre-preg, can have a recess for receiving the die 100. a spacer 114b, such as a pre-preg, or insulating layer can be between the die 100 and the back conductive layer 130. The back conductive layer 130 (e.g., a copper foil), which can be referred to as "layer 3" or "L3." FIG. 21 shows the embedded die assembly. Although not shown in the cross-section view of FIG. 21, for simplicity of illustration, the die assembly would include the die 100, the conductive pattern (e.g., conductive layer 2 108), and the standoffs 126, as disclosed herein.

Figure 22:
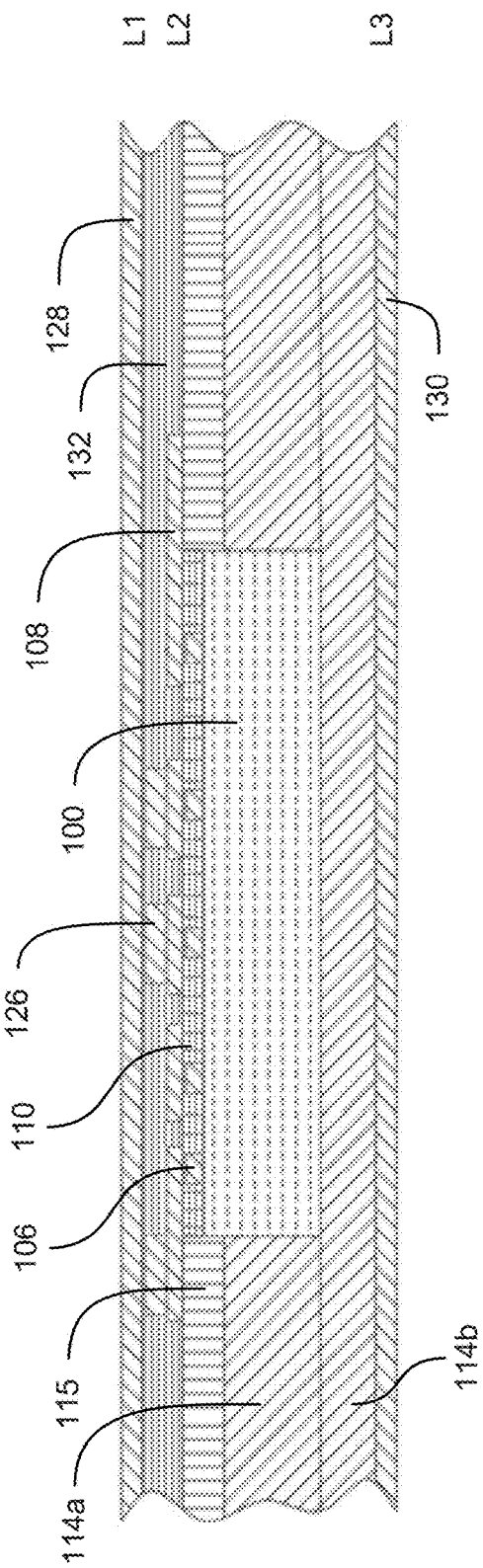
FIG. 22 shows a cross-sectional view of another example embodiment of an assembly with an inner conductive layer and two outer conductive layers.
Figure 23:
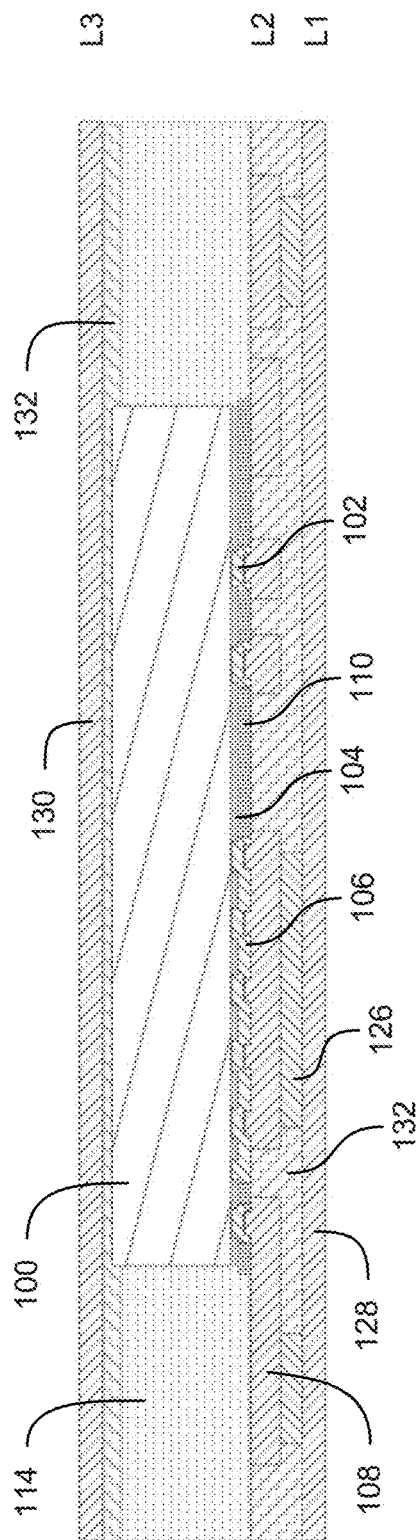
FIG. 23 shows a cross-sectional view of another example embodiment of an assembly with an inner conductive layer and two outer conductive layers.
Figure 24:
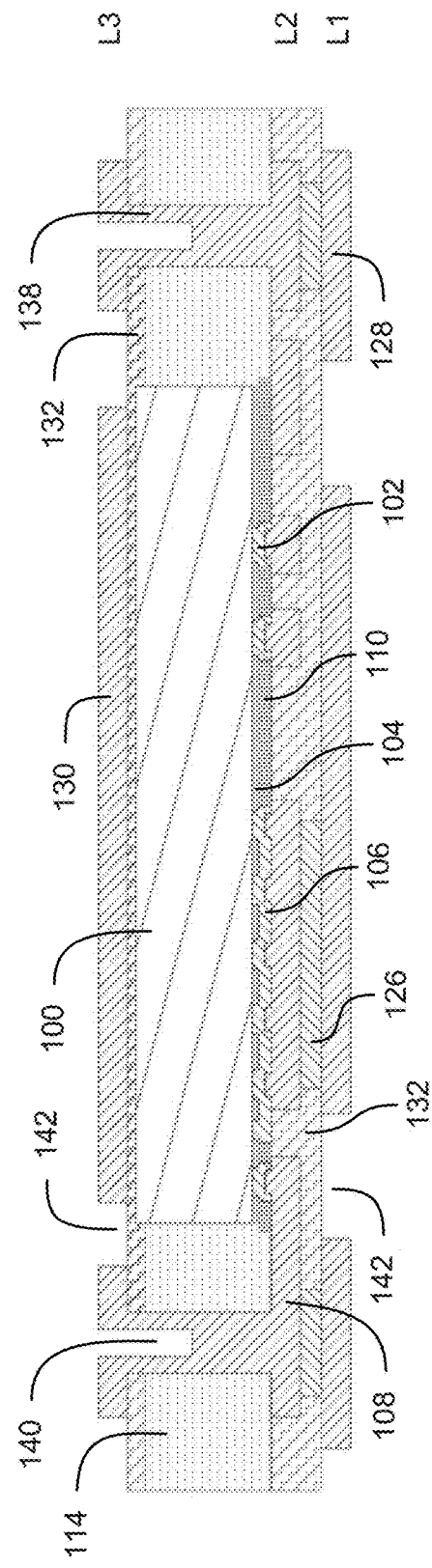
FIG. 24 shows a cross-sectional view of an example embodiment of an assembly in which portions of the inner conductive layer and two outer conductive layers are electrically coupled.

A cross-section is provided in FIG. 22 that shows the RDL 106, glue 110, conductive layer 108 (L2), and the standoffs 126. Various alternatives are possible. For example, the pre-pregs 114a, 114b can be omitted, and the fill and flood material 115 can fill the space of pre-preg 114a. Various other types of spacers or filler material can be used. FIG. 23 shows another example embodiment, which can be made similar to FIG. 15, except that the conductive layer 112, and its associated raised portions 126 and steps, can be omitted. FIG. 24 shows the embodiment of FIG. 23, after steps similar to those of FIGS. 16, 17, and 18 are performed. The conductive layer 128 can be electrically coupled to the standoffs or raised portions 126. One or more contact openings 136 can be formed in the back side through the conductive layer 130, through the filler material 132, through the spacer 114, and into the conductive layer 108. The contact openings 136 can be at least partially filled with a conductive material 138, for example to electrically couple portions of the conductive layer 108 to the corresponding portions of the conductive layer 130. A conductive pattern can be formed in the conductive layer 128, as discussed herein, such as by etching. A conductive pattern or discrete contact areas can be formed from the conductive layer 130, such as be etching, as discussed herein.

Figure 25:
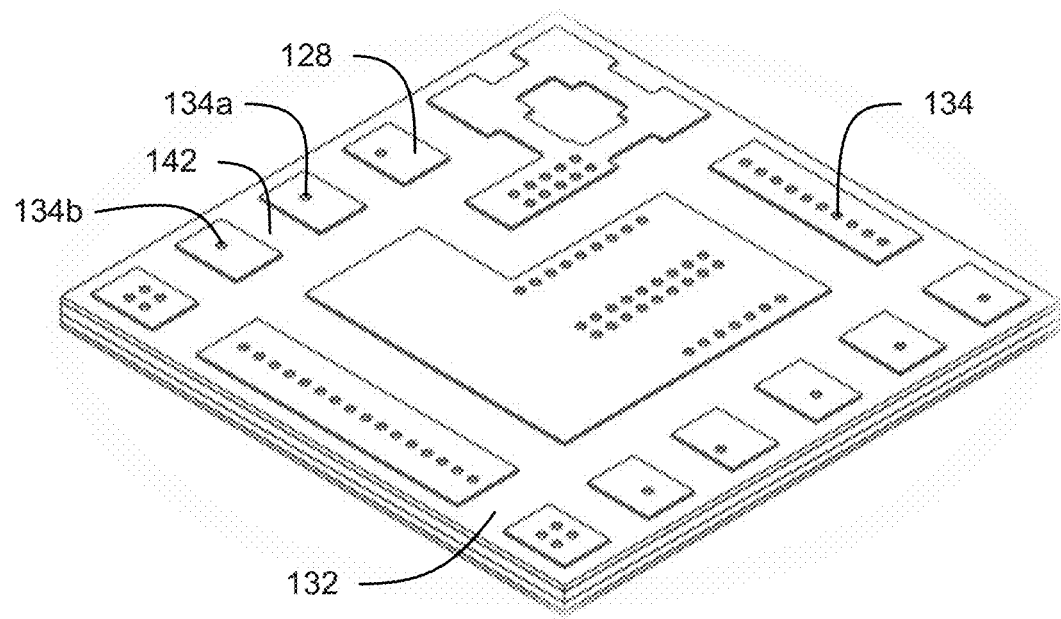
FIG. 25 shows a perspective view of an assembly with openings formed in an outer front conductive layer.

With reference to FIG. 25, the conductive material (e.g., copper) on conductive layer 128 (Layer L1) can be etched to form a circuit pattern and/or to open out vias or openings 134 down to the standoffs 126, which can be considered part of layer L2 or as a coupling between layers L1 and L2 (e.g., similar to the discussion in connection with FIGS. 16 and 18). The circuit pattern can be formed before or after the vias/openings 134, or together with the vias/openings 134 during the same etching pass. In some cases, these vias/openings 134 don't need drilling, as the vias/openings 134 can be formed at areas over the raised portions 126 or standoffs that were formed by the second plating stage on layer L2 so that there is only limited resin under the openings 134. The bottoms of the vias/openings 134 can be cleaned with a laser, plasma, or wet chemical, etc. to remove any thin layers of resin, which can expose the underlying conductive material of the standoffs 126. The conductive material pattern can be formed by creating (e.g., etching) gaps 142 in the conductive material 128, as discussed herein.

Figure 26:
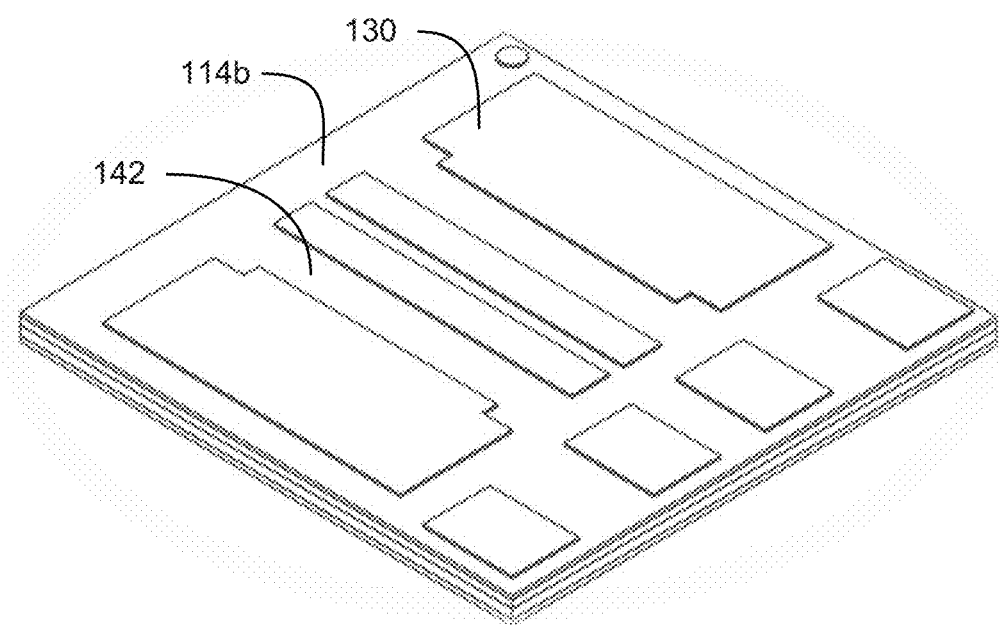
FIG. 26 shows a perspective view of an assembly with a conductive patter formed in the outer back conductive layer.

With reference to FIG. 26, the conductive material (e.g., copper) of conductive layer 130 (Layer L3) can be removed (e.g., etched) to form a circuit pattern. The pattern in the conductive layer 130 can be formed before or after the contact openings 136 and barrel vias are formed (as discussed in connection with FIGS. 27 and 28). Gaps 142 can be formed between portions of the conductive material 130 to form the pattern or separated contact areas.

Figure 27:
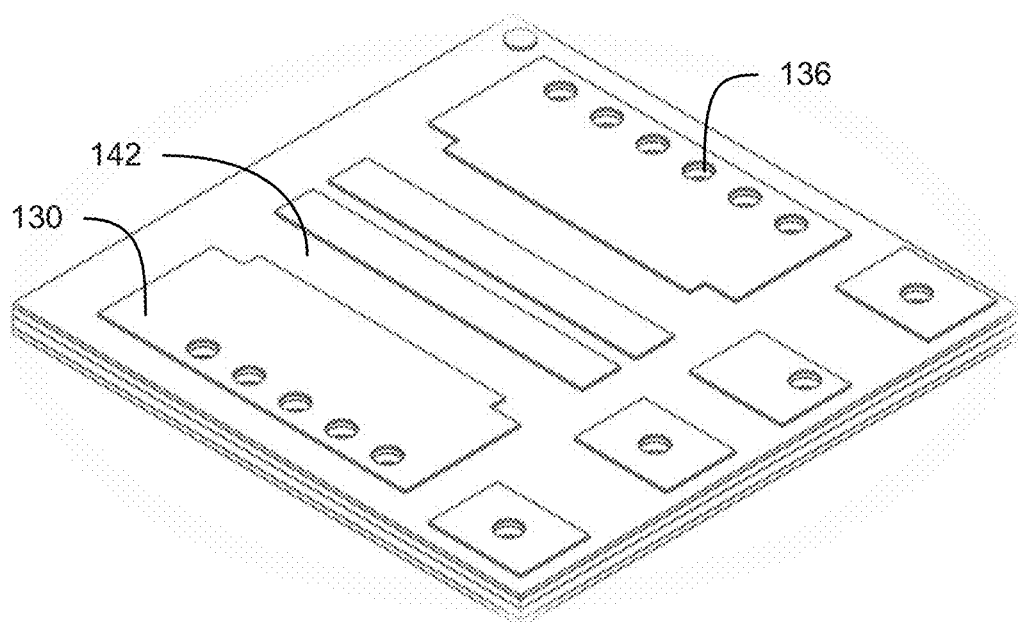
FIG. 27 shows a perspective view of an assembly with holes formed in the back side, such as from drilling.

In this 3-conductive-layer embodiment, an electrical connection can be formed between conductive layers 108 and 130 (Layer L3 and Layer L2). There can be a relatively large separation between conductive layers 108 and 130 (layers L2 and L3) due to the die thickness. Therefore, in some cases, there are no vias etched into layer 3. Rather holes 136 can be drilled and then plated to form vias that electrically couple conductive layers 108 and 130 (layer L3 to layer L2). The panel can be depth drilled from the back. The drilling can stop on L2, such as to form blind vias. Laser drilling to form the vias can be used. Mechanical depth drilling can be used. The drilled via count is relatively low, such as due to the vias formed by etching. Any suitable drilling technology can be used, especially since relatively few drilled vias are used. One or more holes 136 can be formed in the back side through the conductive layer 130, through the spacer 114 (e.g., through pre-preg 114b, pre-preg 114a, and/or the flood material 115), and into the conductive layer 108. FIG. 27 shows the holes 136.

Figure 28:
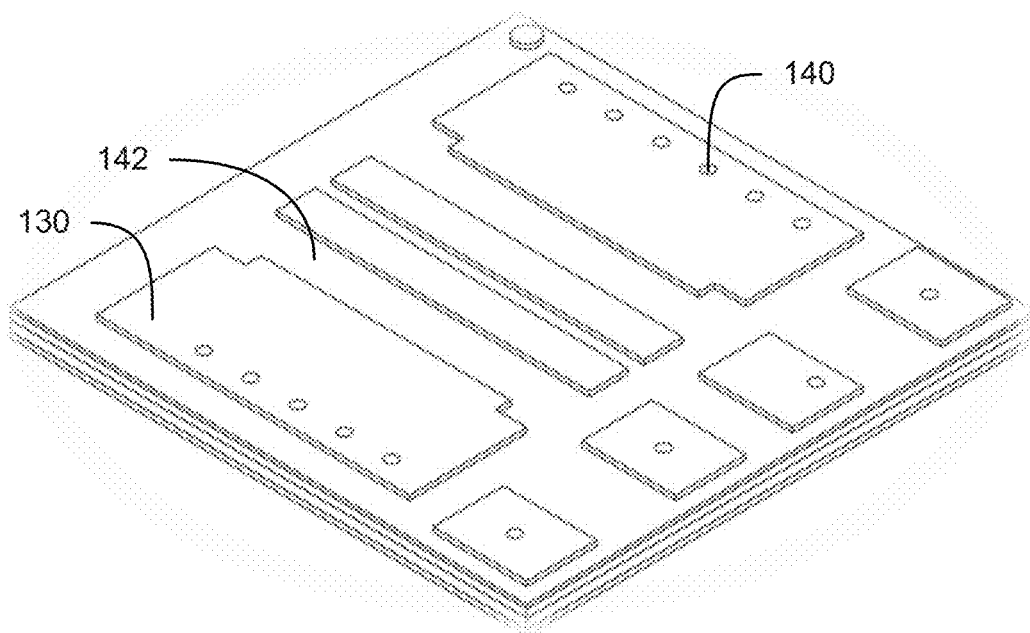
FIG. 28 shows a perspective view of an assembly with the holes partially filled to form barrel vias.

The panel can be plated up to fill the etched vias or openings 134 on the front side, and to form barrel plated blind vias on the back side (L3). FIG. 28 shows the back side after the holes 136 have been coated or partially filled to form barrel vias. A recess 140 can be formed in the middle of the barrel vias. In some cases, the drilled vias or holes 136 can be filled completely, rather than creating barrel plated vias. In some embodiments, the panel can be finished in electroless nickel immersion gold (ENiG).

Figure 29:
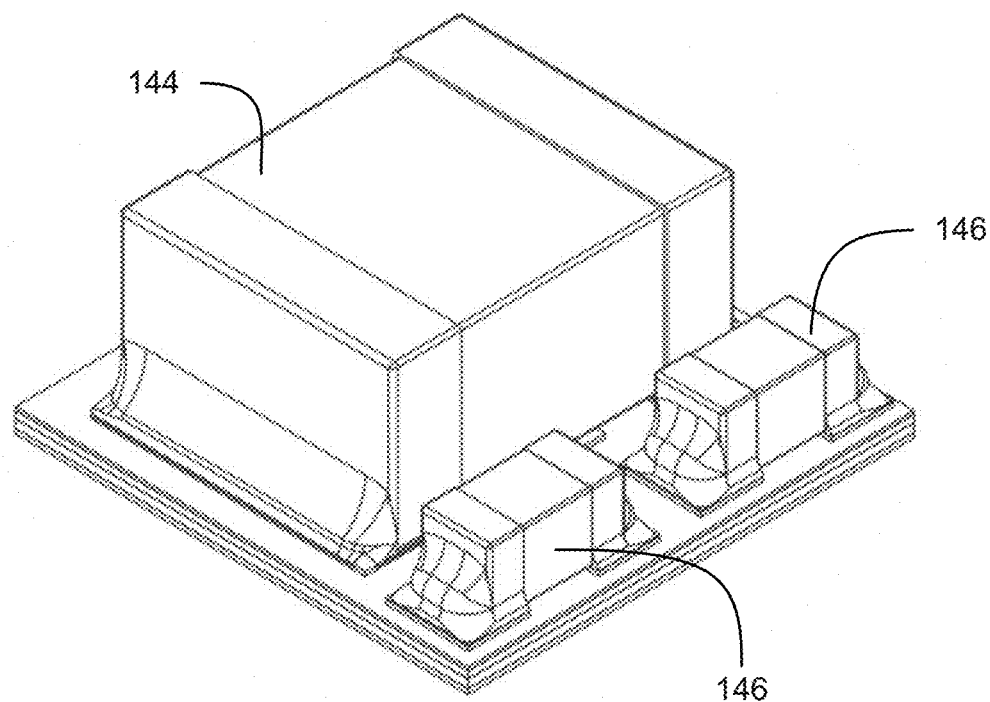
FIG. 29 shows a back perspective view of an assembly with an inductor and two capacitors coupled thereto.
Figure 30:
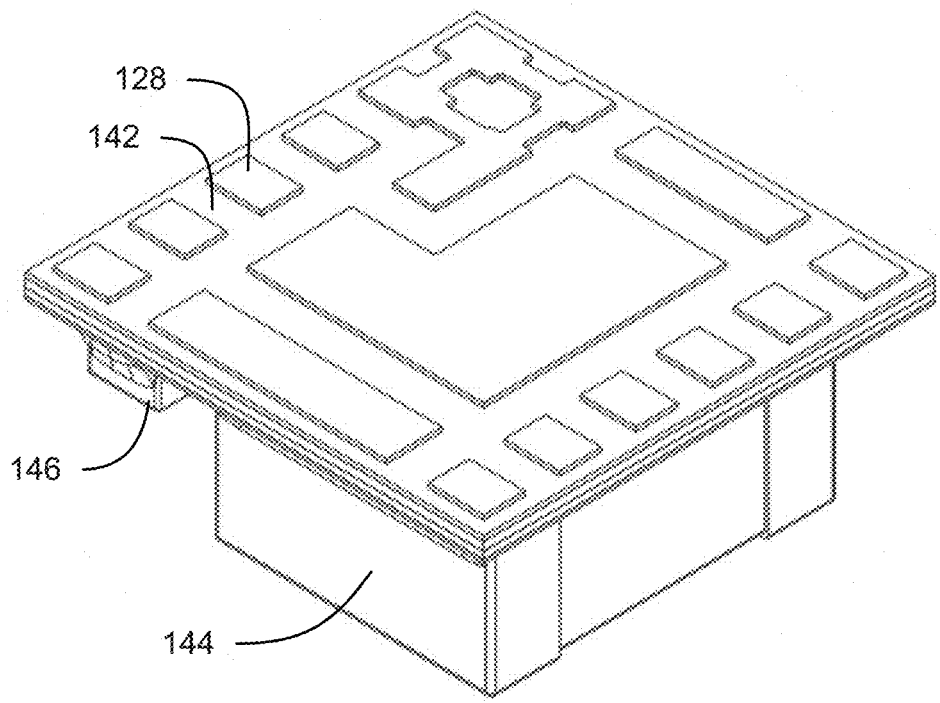
FIG. 30 shows a front perspective view of an assembly with an inductor and two capacitors coupled thereto.

With reference to FIGS. 29 and 30, the devices can have additional components mounted thereon, such as passive electrical components (e.g., one or more inductors and/or capacitors). Testing can be in panel or as singulated devices. The devices can be singulated, such as using a sawing technology on tape, similar to wafer sawing. In the embodiments illustrated below, an inductor 144 and a pair of capacitors 146 can be mounted onto the device (e.g., on the back side). The techniques and embodiments disclosed herein can be used to make various types of electrical devices, such as a power converter, a buck converter, a boost converter, a voltage regulator, an alternating current (AC) to direct current (DC) power converter, a DC-DC power converter, or other devices disclosed in U.S. Pat. No. 10,193,442, issued Jan. 29, 2019, and titled CHIP EMBEDDED POWER CONVERTERS, the entirety of which is hereby incorporated by references. For example, the die 100 can include circuitry configured to receive an input voltage and modify the voltage to output a different (e.g., higher or lower) voltage. The die 100 can include one or more power switches, and a driver and/or a controller (e.g., a pulse width modulator controller), which can operate the one or more power switches to modify the voltage. The die 100 or other embedded circuitry can be coupled to the inductor 144 and/or capacitors 146 through vias. The die 100 or other embedded circuitry can be coupled to the inductor 144 and/or capacitors 146 through portions of the conductive layer 130, the drilled vias, and portions of the conductive layer 108 (and in some cases also portions of the conductive layer 128 and raised portions 126, depending on the configuration). When mounted onto a device with contacts on both sides of the die 100 (e.g., a 4 conductive layer embodiment), the die 100 or other embedded circuitry can be coupled to the inductor 144 and/or capacitors 146 through portions of the conductive layer 130, corresponding raised portions 126, and portions of the conductive layer 112. In FIG. 29, the front side is shown with the openings 134 of FIG. 25 filled (e.g., plated), which can electrically couple portions of the conductive layer 128 to the underlying raised portions 126. The footprint of the inductor 144 and/or of the one or more capacitors 146 can at least partially overlap with the footprint of the die 100 or other embedded circuitry.

Figure 31:
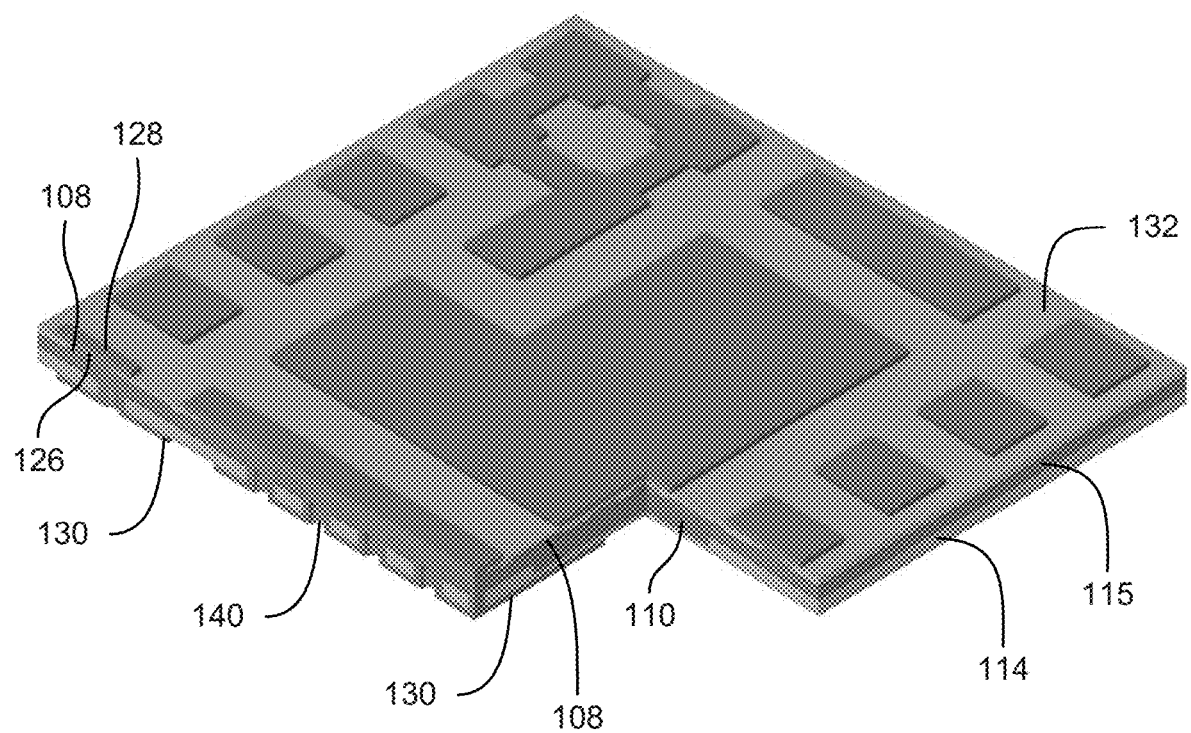
FIG. 31 is a cutout perspective view of an example embodiments of an assembly with embedded circuitry.

A cutout perspective view of the device is shown in FIG. 31. Conductive layer 108 (Layer L2) can be etched to create holes and the holes can be plated (or otherwise filled) through to the die 100 (e.g., to the RDL 106) to create a connection to the die 100. Raised portions 126 can be formed on the conductive layer 108 (layer L2), and the filler material 132 (e.g., Zetabond) can fill in around the raised portions 126. Conductive layer 128 (layer L1) can sit directly on raised portions 126 of layer L2. The etched holes in the conductive layer 128 (layer L1) can be plated to the raised portions 126 of layer L2. This technique can be used to make electrical connections (e.g., for ground or voltage input or voltage output, or any other suitable signal type) directly through to the die 100 under the respective pads or contact points on the conductive layer 128 (layer L1). Blind vias can be drilled from the conductive layer 130 (layer L3) to conductive layer 108 (layer L2), and can be at least partially filled (e.g., plated) to electrically connect the conductive layer 130 (layer L3) to conductive layer 108 (layer L2). Thus, in some embodiments, inputs and outputs can be coupled to the die 100 on both the front side and the back side of the device.

Figure 32:
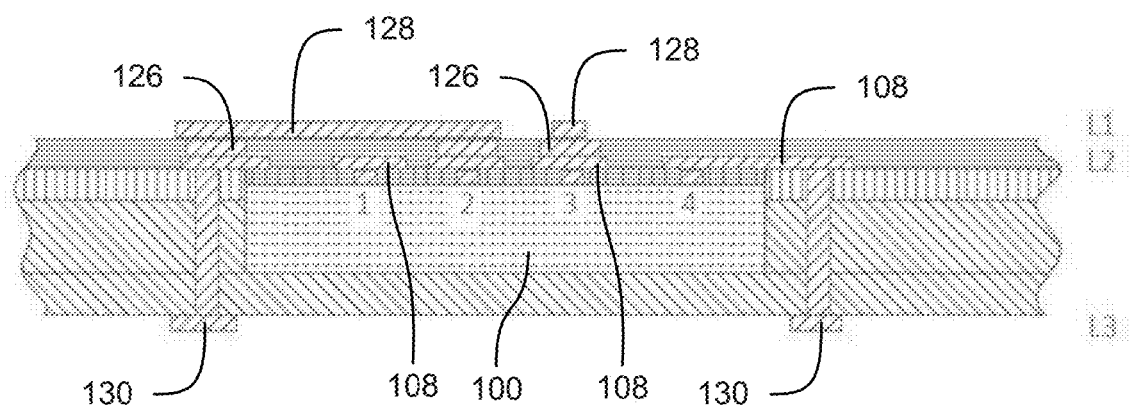
FIG. 32 shows a cross-sectional view of an example embodiment of an assembly with an die that has four contacts.

A cross-section is shown in FIG. 32 with 4 contacts on the die 100 (e.g., on the front side thereof). The contacts are labeled 1, 2, 3, and 4 in FIG. 32. Signals and/or power can be provided to or from the die 100 through various pathways and through various layers. Signals can be sent to or from contact 3 on a front side of the die 100 through a contact pad on conductive layer 128 (Layer L1), through a standoff 126 under the contact pad, through a portion of conductive layer 108 (layer L2) that is under the standoff 126, and to the contact 3 on the die 100 that is under the portion of conductive layer 108 (layer L2). In some cases, the signal can go through a portion of the redistribution layer (RDL) 106 between the die 100 and the portion of the conductive layer 108 (layer L2). Signals can travel through conductive layer 128 (layer L1), through a standoff 126, through conductive layer 108 (layer L2), optionally through the RDL 106, and to the die 100, or in the reverse direction for signals sent from the die 100. Signals can be sent to contact 4 on the front side of the die 100 through a contact pad on conductive layer 130 (layer L3) (e.g., on the back of the device), through the drilled via, through conductive layer 108 (layer L2), to the die contact or associated RDL portion, or signals can be sent in the reverse direction for signals output by the die 100. In some cases, signals can be delivered to the back side of the device without going through conductive layer 128 (L1). Signals can be sent to contact 2 on the front side of the die 100 through a contact pad on the conductive layer 130 (layer L3) (e.g., on the back of the device), through a drilled via, through a portion of conductive layer 108 (layer L2), through a standoff 126, through a pathway on conductive layer 128 (layer L1), through another standoff 126, through another portion of conductive layer 108 (layer L2), and to the die contact 2 or associated RDL portion. Signals can be sent in the reverse direction for signals output from the die 100. Contact 2 can be accessible from the front side as well, such as through the portion of conductive layer 128 (layer L1) that is electrically coupled to contact 2. Accordingly, a contact 102 on the die 100 can be electrically accessible from the front and/or back of the device. Contact 1 can be accessible through an associated pathway on conductive layer 108 (layer L2), where no standoff is positioned above the contact 1. For example, the pattern of conductive layer 108 (layer L2) can couple the drilled via shown on the right side to contact 1 instead of, or in addition to, contact 4. In some cases, the pattern of the conductive layer 108 (layer L2) can couple the contact pad that is shown above contact 3 to contact 1 in addition to contact 3 (or alternatively contact 3 could be omitted).

Another Example 4 Layer Design

Another example 4-layer design is discussed. The die 100 can optionally have a metallization layer on the backside of the die 100, which can allow the via connections on the back side similar to the via connections on the front side, as discussed herein. A die 100 can have connections on the front and back sides. A pair of dies 100 can be arranged (e.g., face to face) with the connections for the first die facing in a first direction (e.g., forward) and the connections for the second die facing in a second direction (e.g., backwards) that is substantially opposite the first direction. More complex structures, such as dies facing in different directions with complex connections, may involve more cleaning after opening out as the side of the die that is not in the glue can have a thicker resin layer to clear. The dies can be adhered to each other or otherwise coupled together.

In some cases both the back side and the front side can have a passivation layer 104 or material and/or a redistribution layer (RDL) 106, although these features can be omitted in some implementations. The glue application to a conductive material (e.g., that will become layer L2), the bonding of the die (e.g., front side of the die) to the conductive material 108 using the glue 110, and/or the underfill and flood steps can be performed the same as for the 3 layer design, or other embodiments discussed herein. As discussed herein, in some embodiments, the underfill and flood steps can be omitted, and different spacers or filler materials or techniques can be used.

Figure 33:
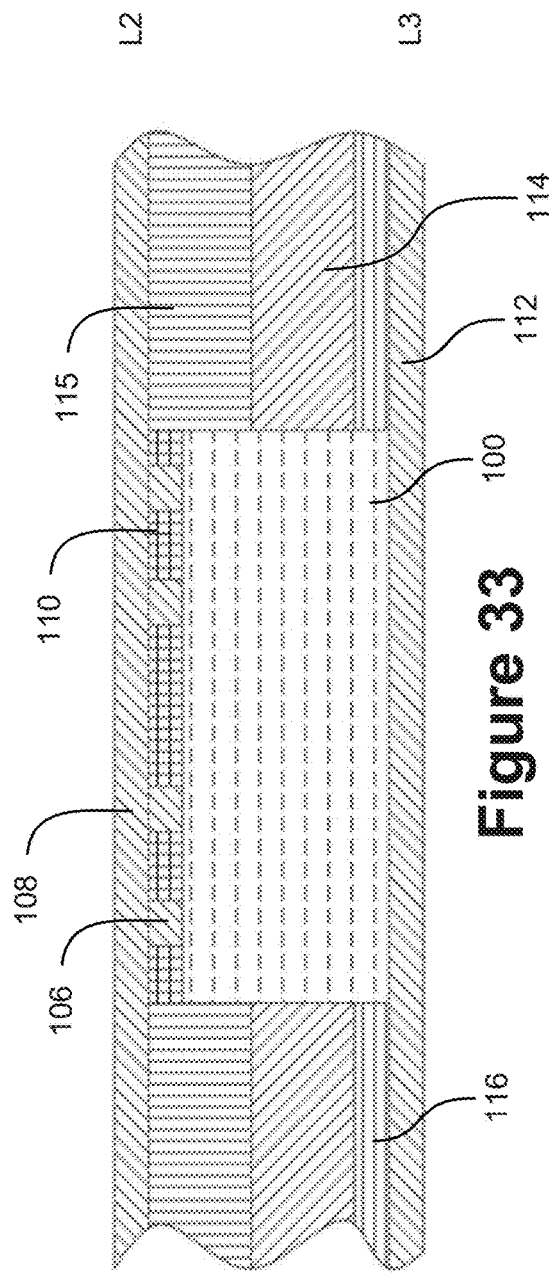
FIG. 33 shows a cross-sectional view of an example embodiment of an assembly with front and back conductive layers.

With reference to FIG. 33, for example, a conductive layer 112 (e.g., copper foil) can be applied (e.g., laminated) to the back side of the die 100. A spacer 114 (e.g., a machined pre-preg spacer) can fill at least some of the space around the die 100. Fill and/or flood material 115 can also surround a portion of the die 100. Filled resin 116 (e.g., Zetabound) or other adhesive can be used between the die 100 and the back conductive layer 112 (e.g., foil). The die 100 can be embedded deep into the resin 116. A very thin resin layer can be between the die 100 backside and the conductive layer 112 (e.g., copper foil).

The panel can have etch resist applied and the conductive layers 108 and 112 (L2 and L3) (e.g., copper foils) can be etched back to open the vias to the die 100 (e.g., on both sides) and/or to create the L2 and L3 metal/conductive circuit patterns. The vias and patterns can be formed by the same etching pass, or as separate etching passes. The front and back can be etched separately or together at the same time. The vias can be cleaned, such as to remove glue or Zetabond (or other joining or filler material), so as to expose the underlying die contacts 102 or associated RDL portions 106. If multiple dies 100 facing in different directions are embedded, then the dies 100 that are placed face up in the die-bonding may require extra cleaning as the resin residuals from the Zetabond or other adhesive can be thicker and less controlled than those on the side where the die 100 is inserted into the die attach glue. The vias and pattern formed in conductive layer 108 (L2) on the front side (shown in FIG. 33) can be the substantially the same as the 3-layer design, or other embodiments disclosed herein (e.g. as shown in FIG. 20). The vias and pattern formed in conductive layer 112 (L3) on the back side can be formed similarly, but the circuit pattern and/or via locations can be different, depending on the configuration. The panel can be pattern plated on both sides (together or as separate passes) to fill the vias to the die 100 and connect the die 100 into the circuit patterns formed in the conductive layers 108 and 112. FIG. 12 shows the front side with the filled vias. While only L2 on the front side is shown in FIG. 12, L3 on the back side can be similar, but the circuit pattern and/or via locations can be different. Standoffs or raised portions 126 can be formed on the front and back sides (e.g., together or as separate passes). A second plating process can be applied to create standoffs on layer 2 (front side) and layer 3 (back side). The raised portions can be similar to the other embodiments discussed herein, such as shown in FIGS. 13 and 14. As discussed herein, the conductive material (e.g., copper) on layers 128 (L1) and 130 (L4) can be pushed down to contact, or nearly contact, the standoffs 126 during the later lamination process. Although only the front standoffs 126 on L2 are shown in FIG. 14, the backside standoffs 126 on the L2 layer can be similar, but the circuit pattern, via locations, and/or standoff locations can be different.

Figure 34:
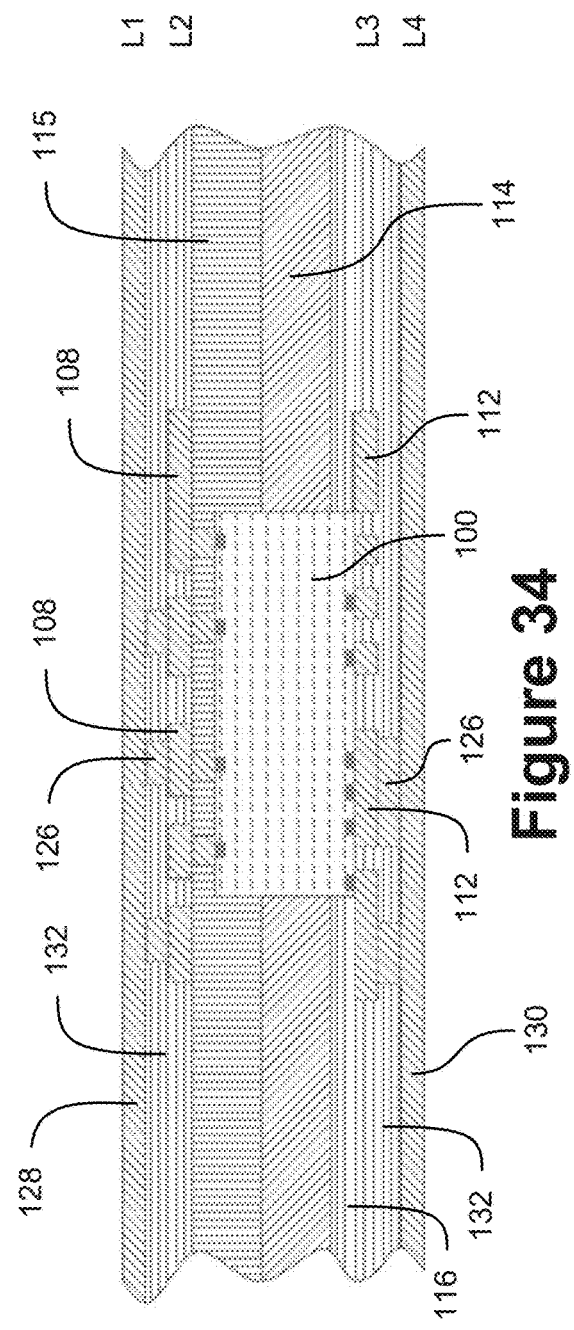
FIG. 34 shows a cross-sectional view of an example embodiment of an assembly with a die that has contacts on both the front and back sites, and with inner and outer conductive layers on both the front and back sides, and with standoffs between the inner and outer conductive layers.

With reference to FIG. 34, the conductive layers 128 and 130 (L1 and L4) can be added to the respective front and back sides. The panel can be laminated on both sides. On the front side, it can use a filled resin system that uses a resin 132 (such as Zetabond) to couple the conductive layer 128 (e.g., copper foil) L1. On the backside, a machined pre-preg 114 with one or more apertures for the die 100 and a thin pre-preg between the die and the backside copper foil can be used. Many alternatives are possible. For example, the front and back can use a filled resin 132 (e.g., Zetabond), other bonding material, and/or pre-pregs. The material(s) that couples the layers L1 and L4 to the device can form around the standoffs 126. The device can have an outer conductive layer 128 (L1) (e.g., copper foil), Zetabond or other resin or filler/binder 132, standoffs, conductive layer 108 (L2), RDL material 106 that couples L2 to the die 100, glue or other binder 110, which can at least partially surround the RDL portions 106, fill and/or flood layer 115 (e.g., optional) which can at least partially surround the glue 110 and/or RDL 106, and in some cases, can extend up or down part of the die, a pre-preg 114 that can be machined to fill around the die 100, Zetabond or other resin or filler/binder 116, conductive layer 112 (L3), standoffs 126, Zetabond or other resin or filler/binder 132, and conductive layer 130 (L4) (e.g., copper foil). In some cases, the pre-preg(s) can be omitted, and Zetabond or other filler material can be used (e.g., to span the die thickness). Many other alternatives are possible, as described herein.

The conductive material (e.g., copper) on the conductive layer 128 (Layer L1) can be removed (e.g., etched) to form a circuit pattern and/or to open out small vias down to layer L2 (e.g., to the standoffs 126), similar to other embodiments discussed herein. These vias can be formed without drilling as the vias can be formed over the standoffs 126 (e.g., which were formed by the second plating stage on layer 2). A little resin can be under the openings, and the resin can be cleaned to expose the standoff material. The bottom to the vias can be cleaned with a laser, plasma, or wet chemical, etc. to remove the thin layer of resin. The vias and circuit pattern can be similar to the 3-layer design front side shown herein.

Figure 35:
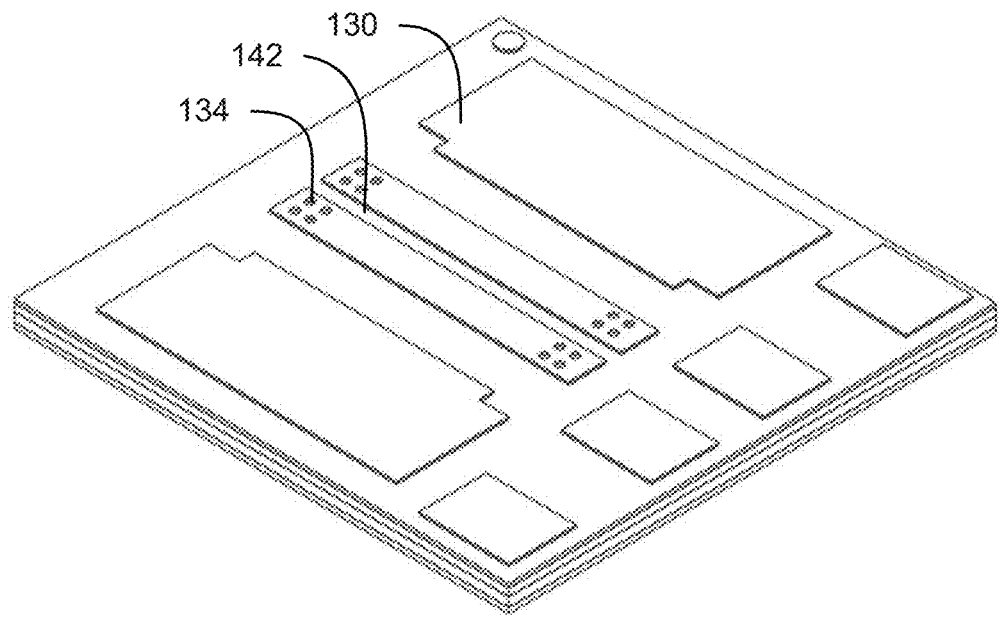
FIG. 35 shows a perspective view of an example embodiment of an assembly with openings formed on the back outer conductive layer.

With reference to FIG. 35, some of the conductive material (e.g., copper) of conductive layer 130 (Layer L4) can be removed (e.g., etched) to form a circuit pattern or outline and/or open out small vias 134 down to layer L3 (e.g., to the backside standoffs 126), similar to the front side except that the circuit pattern can be different and/or the vias 134 can have different locations. These vias 134 can be formed without drilling as these vias 134 can be located over the backside standoffs 126 (e.g., which were formed by the second plating stage on layer L3). A little resin can be at the bottom of the vias 134 after etching (e.g., due to the resin pressed between the L4 layer 130 and the standoffs 126 during lamination). The bottom of the vias 134 can be cleaned with a laser, plasma, or wet chemical, etc. to remove the thin layer of resin, for example.

Figure 36:
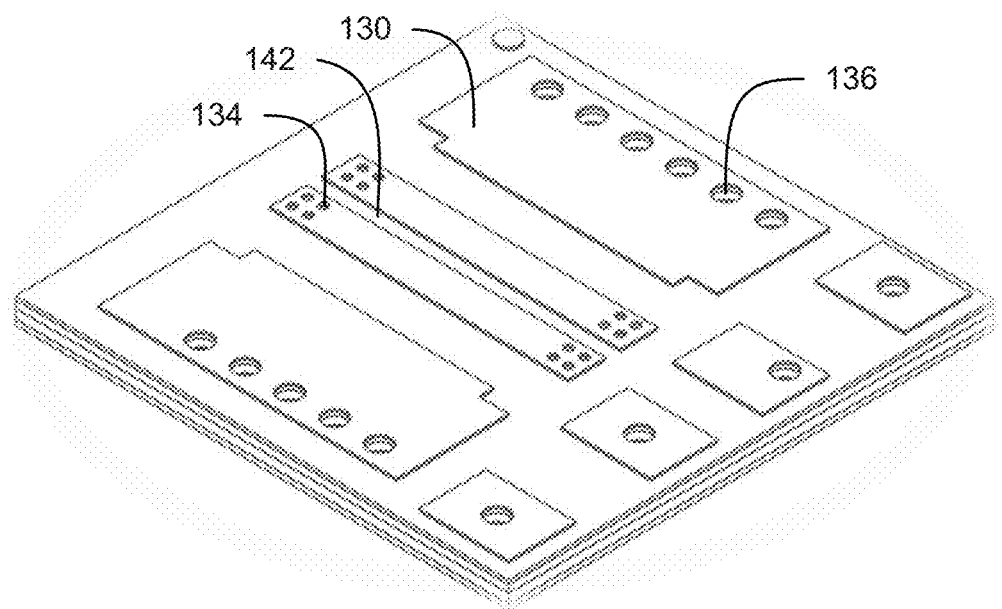
FIG. 36 shows a perspective view of an example embodiment of an assembly with holes drilled into the back side.

With reference to FIG. 36, the panel can be drilled from the back, similar to other embodiments disclosed herein. The drilling can stop on the conductive layer 108 (L2) to form blind vias or holes 136. The panel can be plated up to at fill the etched vias 134 both front and back (e.g., as a single pass or as separate steps). The drilled vias or holes 136 can be plated as well, and can form plated barrel vias, as discussed herein (although fully filled vias can be formed as well). The back side with conductive barrel vias formed in the drilled holes 136 can look like FIG. 28. The back side with fully filled holes 136 to provide the vias can externally look like FIG. 26.

The 4-layer embodiment can be similar to the 3-layer embodiment, except that contacts on the back side of the die are electrically accessible (e.g., on the front and/or back side of the device). The cross-section shown in FIG. 37 includes some examples of electrical interconnections that are possible. The cross-section can have four contacts on the front side of the die 100, which can be accessible on the front and/or back of the device, similar to the 3-layer embodiments disclosed herein (e.g., see FIG. 32). The cross-section shown in FIG. 37 can have six contact on the back side of the die 100, and those contacts can be accessible on the front and/or back of the device. For example, signals can be delivered through a contact pad on a portion of layer 130 (L4), through a backside standoff 126, through a portion of layer 112 (L3), and to the die contacts. Signals can be sent from the die 100 in the reverse directions. In some cases, an RDL 106 material can be used, similar to the front side. The circuit pattern(s) (e.g., on layer 112 (L3) and/or layer 130 (L4)) can route electrical signals so that contacts on different parts of the die 100 can be accessible on different areas of the device. Also, signals can be delivered to a contact pad on layer 128 (L1), and the signal can be transferred through the conductive material 138 in the drilled via to a back side die contact. By configuring the circuit patterns on L1, L2, L3, and L4, and the standoff locations, and the drilled vias, signals can be routed from any contact pad (e.g., on the front or back of the device) to any die contact (e.g., on the front or back of the die or die assembly). After completion the devices can have other components mounted thereon (e.g., inductor and/or capacitors).

Figure 37:
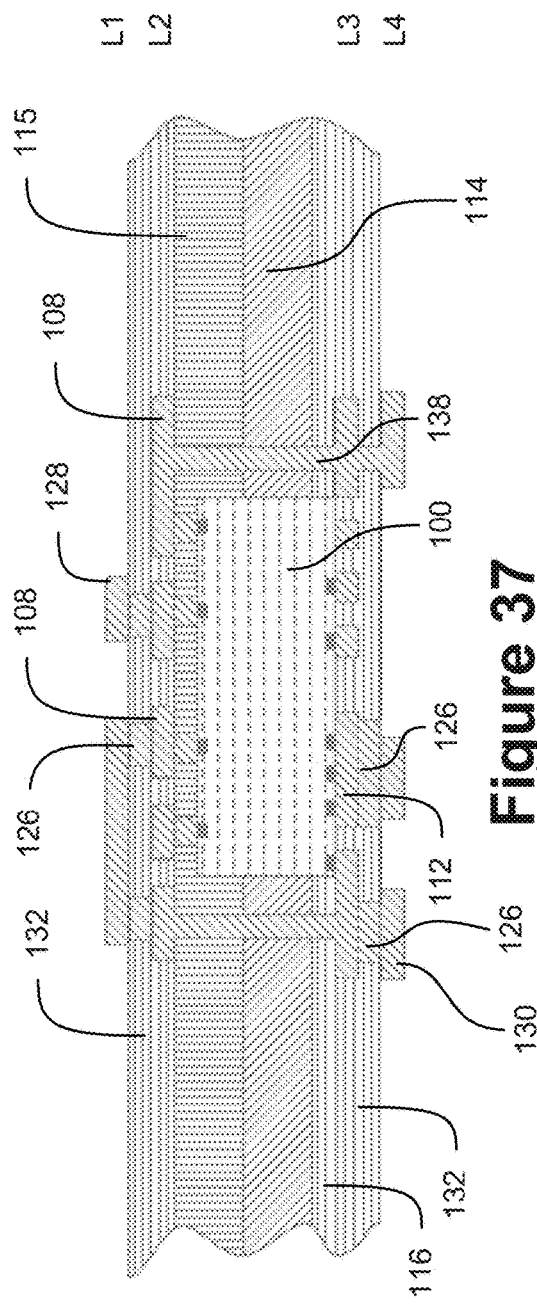
FIG. 37 shows a cross-sectional view of an example embodiment of an assembly where the standoffs electrically couple the outer conductive layer to the inner conductive layer, on both the front and back sides, and wherein the drilled holes have conductive material to electrically couple portions of conductive layers.
Figure 38:
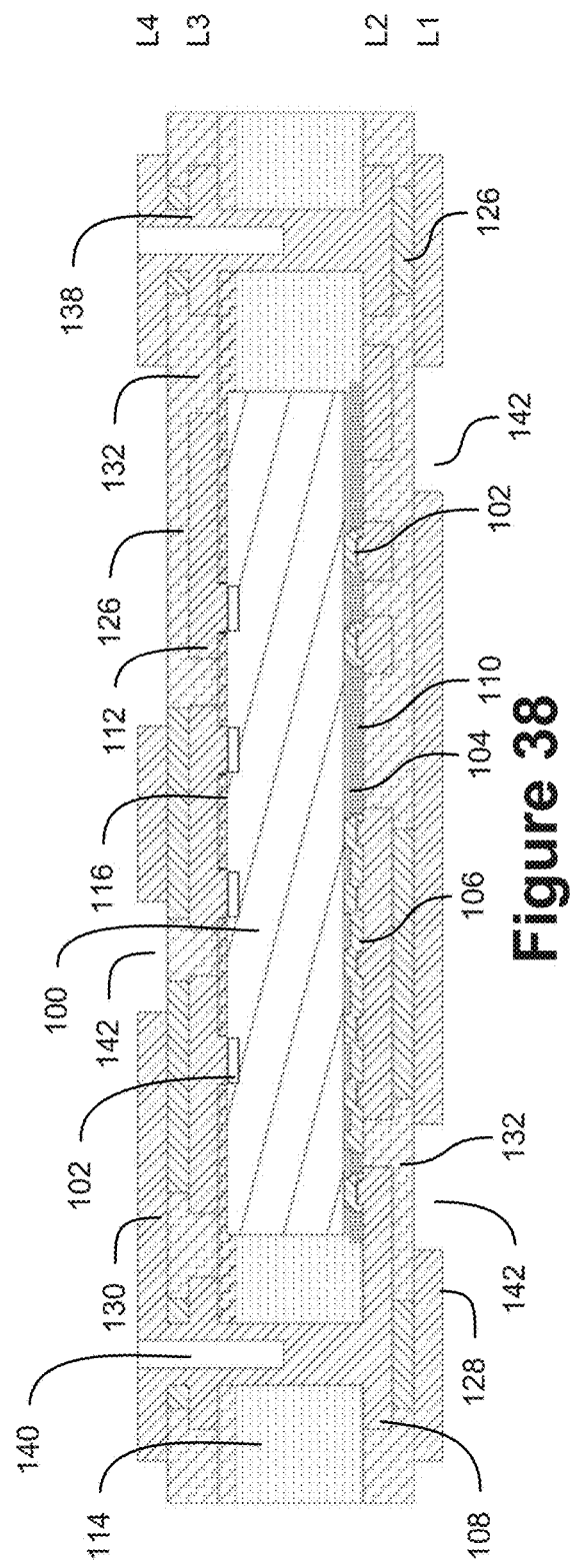
FIG. 38 shows a cross-sectional view of another example embodiment of an assembly where the standoffs electrically couple the outer conductive layer to the inner conductive layer, on both the front and back sides, and wherein the drilled holes have conductive material to electrically couple portions of conductive layers.

Many variations are possible. In FIG. 37, the drilled via on the right goes through an area where there are no standoffs 126, whereas the drilled via on the left goes through one of the back standoffs 126. A front-side standoff 126 can align with the drilled via, or not. In some cases, at least some of the standoffs 126 can be omitted. For example, if signals are only received on the front side, through L1, then the backside standoffs 126 can be omitted. Signals can be routed to the backside contacts through the drilled vias and through layer 112 (L3). If signals are only received on the front side, then the front-side standoffs can be omitted. Signals can be routed to the front side through the drilled vias and through layer 108 (L2). The die 100 can be an integrated circuit (IC). The die can be replaced with any circuitry or electrical component. Various steps and features can be interchanged between the embodiments disclosed. FIG. 38 is a cross-sectional view of an example embodiments of an assembly, which is similar to FIG. 18, except that the back-side contacts 102 of the die 100 are shown. Openings can be formed (e.g., etched) through the layer 112 over the back-side contacts 102, and those openings can be filled with conductive material to electrically couple the back-side contacts to the portions of the layer 112. Similar to FIG. 37, signals can be delivered to or received from the front or back side of the device to contacts 102 on the front of the die 100 or on the back of the die 100. In some embodiments, an insulating material can be added to the gaps 142, such as for insulating separated portions of the respective conductive layers 128 and/or 130.

The features and techniques disclosed herein can reduce the amount of drilling used to form the device. In some cases, no laser-formed vias are made. The features and techniques disclosed herein can be much less stressful for the die as compared to conventional approaches. Larger area contacts and shorter contact lengths can be formed from layer to layer. A Multi-material stack can make the laminate more rigid. The features and techniques disclosed herein can be more additive processing and less subtractive processing than conventional approaches. The features and techniques disclosed herein can provide lower cost than other technologies, lower sequential processing and higher batch processing, improved yield, reduced defects, and/or faster processing. In some embodiments, the only vias that are formed by drilling span across a width of the die 100. In some implementations, the device does not have any drilled vias that do not extend from one side of the die 100 to the other side of the die 100. All the vias on the front side of the die 100 or on the back side of the die 100 can be formed by etching. In some cases, none of the vias formed on the front side of the die 100 or on the back side of the die 100 are formed by drilling. In some embodiments, the only drilled vias on the device are positioned to the side of the die 100, and do not overlap the footprint area of the die 100.

The method of connection to the RDL can be beneficial. The RDL itself can be partitioned into contacts or sets of contacts. In the case of the IC shown in some embodiments, it can be seen that there are a number of logic contacts and blocks or strips, which can be power contacts. When the die 100 is mounted to the patterned glue 110, there can be a cavity formed between the contact area of the RDL 106 and the foil (e.g., layer 108). The cavity is an interesting feature for the etching process. When the via is etched through the copper foil it can break-through in the center first. As the etchant contacts the surface of the RDL it can start to etch this too. However, the effect can be limited as the etchant can very quickly finish the via opening, and this can even be considered to be part of the cleaning process for the RDL prior to the plating stage. In some cases, the cavity can be clear of resin or glue, etc., but in some cases there is likely to be some resin in these cavities. The resin can be removed from the cavities, such as by a cleaning step. The separation of the etching process to open the via holes from the etching process for forming the circuit pattern, means that the vias can be more aggressively cleaned with a laser, plasma, or wet chemical processes in some embodiments.

Some processes actually build the die facing upwards. The organic material over the RDL contacts can be generally thicker and is often cleared using laser via drilling. The touch technology can have the die RDL very close to the foil and can have no resin between the RDL and the contact point for the via. In this way the via lengths can be kept to a minimum. A touch via may have a diameter of about 20 μm, about 30 μm, about 40 μm, about 50 μm, about 60 μm, about 70 μm, about 80 μm, or more, or any values therebetween, or any ranges bounded by any combination of these values, although other sizes are possible. A touch via can have a length of about 2 μm, about 3 μm, about 4 μm, about 5 μm, about 6 μm, about 7 μm, about 8 μm, about 9 μm, about 10 μm, about 12 μm, about 15 μm, about 20 μm, or any values therebetween, or any ranges bounded by any of these values, although other sizes can be used. By way of example, a touch via (e.g., formed by the etched holes and/or standoffs) can have a diameter of about 50 μm and a height of less than about 10 μm (e.g., about 5 μm). Other technologies can have vias that are about 25-50 μm in length. The openings in Touch technology can be relatively large, such as about 0.25 mm², about 0.5 mm², about 0.75 mm², about 1 mm², about 1.25 mm², about 1.5 mm², about 1.75 mm², about 2 mm², or any values therebetween or any ranges bounded by any combination of these values, although other sizes can be used. For example, smaller areas can be used, such as for various diameters and sizes disclosed herein. The openings, touch vias, standoffs, etc. can also be any shape.

The connection between the inner layers and the outer layers can be built up as a boss or raised profile created on a conductive (e.g., copper) layer, such as by a plating process. The boss or profile doesn't have to be particularly high as it only needs to space the copper foil far enough from the underlying circuit that shorting or leakage is impeded, a reasonable height range is about 5-50 μm or about 10-30 μm. In this feature, the bosses or profiles can be formed where the connection are located and the conductive layer (e.g., foil) can be squeezed down to touch the bosses or profiles during the lamination process. In some cases a thin layer or portions of Zetabond or adhesive can be trapped between the foil and the raised profiles. Zetabond is only used as an example material, there are a number of other materials that be used. Any type of filled resin sheet, or other coupler, filler, or spacer can be used. Zetabond can be extremely thin over the boss areas or raised profiles after lamination, such as because the material is relatively mobile. This can be beneficial as a later process can be to open out connection vias in the conductive layer (e.g., foil) (e.g., during the etching of the circuit pattern). The thin layer of remaining resin (e.g., from the Zetabond) can be removed using a laser, plasma, or wet-chemistry used traditionally to clean up micro vias after the laser drilling processing (or a combination of these technologies).

Figure 39:
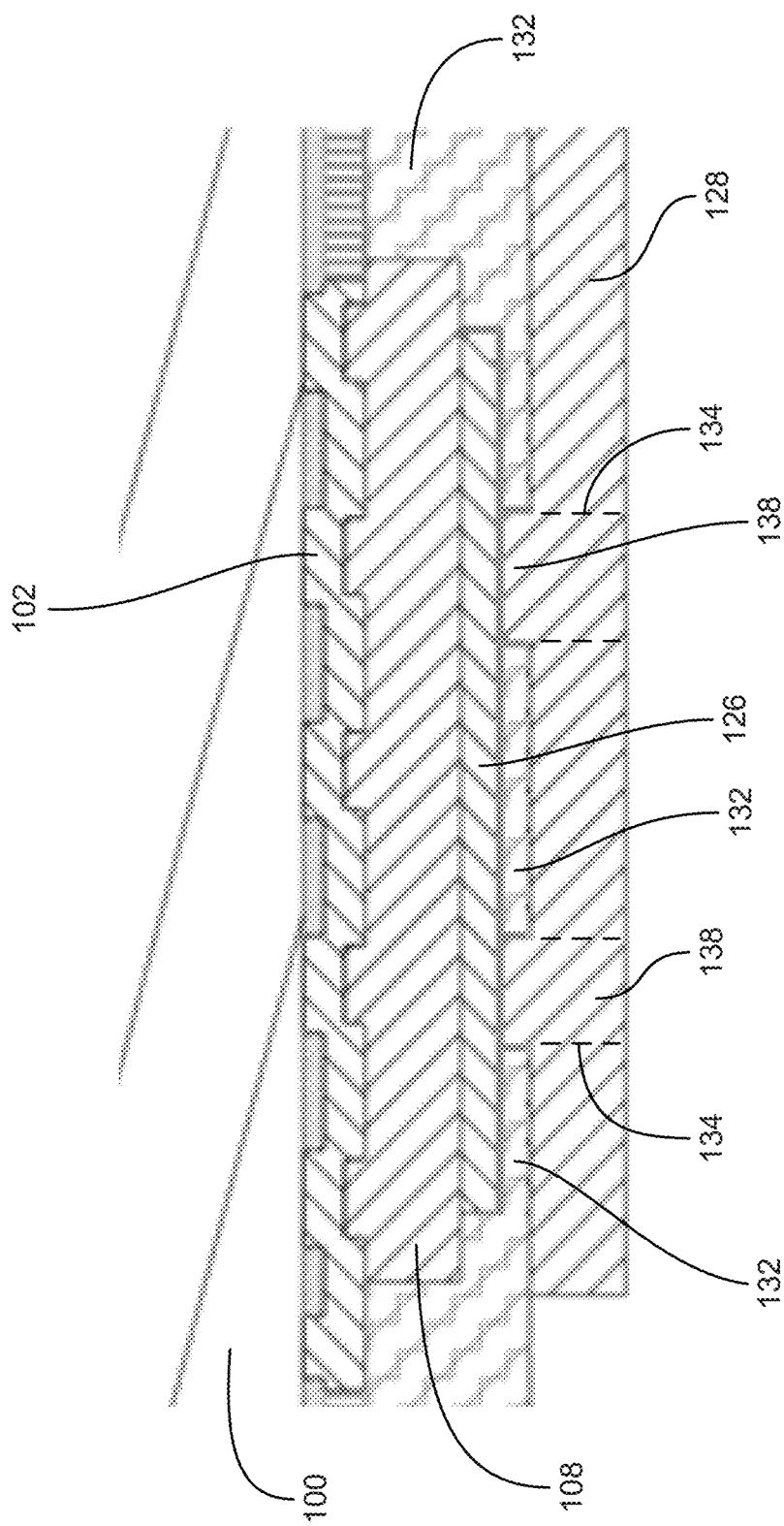
FIG. 39 shows a detailed partial cross-sectional view of an example embodiment of an assembly similar to FIG. 38.

The process can result in a very beneficial product. The connection bosses or profiles can be relatively large and can be any shape. The area of the connection can be extremely large when compared to conventional vias. The etched via in the foil that contacts the boss can be very short, which can mean that even if the contact via has to be small to fill well in the plating process, it can have less impact on the performance compared to conventional micro-vias. Because the interconnection between the conductive layers (e.g., layers 108 and 128 or 112 and 130) is built up using the raised portions 126 or standoffs, the resulting structure can be different from devices in which the conductive layers are first formed and then later interconnected by a via (e.g., by drilling hole between the conductive layers and depositing conductive material in the hole). The standoffs or raised portions 126 are plated onto the underlying conductive layer 108 and/or 112. As discussed, for example, in connection with FIGS. 16, 17, and 25, the outer conductive layer 128 or 130 can be electrically coupled to the underlying standoffs or raised portions 126 by forming openings 134 through the outer conductive layer 128 or 130 (and in some cases also through an adhesive or insulating material 132) to the underlying standoffs or raised portions 126. Those openings can then be filled with a conductive material to provide an electrical connection between the outer conductive layer 128 or 130 and the underlying standoffs or raised portions 126. Accordingly, in some cases only a portion of the area of the standoffs or raised portions 126 are electrically coupled to the overlying conductive layer 128 or 130. As shown in FIG. 14, the standoffs or raised portions 126a and 126b have a first size or area. As shown in FIG. 25, the openings 134a and 134b that correspond to the standoffs 126a and 126b have a second size or area that is smaller than the first size or area. Even when multiple openings 134 are made for connecting to a single standoff or raised portion 126, the total second size or area of those openings 134 is less than the size or area of the underlying standoff or raised portion 126. The second size or area can be about 10%, about 20%, about 30%, about 40%, about 50%, about 60%, about 70%, or about 80% of the first size or area, or any values or ranges therebetween, although in some embodiments other sizes could be used. FIG. 39 shows a detailed partial view of a portion of an embodiments similar to the assembly of FIG. 38. FIG. 39 is a partial cross-sectional view of an example embodiment similar to the device of FIG. 38. A thin layer or small amount of the insulating material 132 can extend into part of the area between the standoff(s) or raised portion 126 and the overlying conductive layer 128. The area where the insulating material 132 extends between the standoff(s) or raised portion 126 and the overlying conductive layer 128 can account for the difference between the first size or area and the second size or area. When the conductive layer 128 was attached (e.g., laminated) onto the device, some amount of the adhesive or other insulation material 132 (e.g., used for lamination) can remain between the standoff or raised portion 126 and the overlying conductive layer 128. In some cases, most and sometimes almost all of the insulating material 132 is pressed out of that area during lamination, but some can remain. In FIG. 39 the thickness of the remaining insulating material 132 is shown exaggerated for ease of illustration. In FIG. 39, the location where the openings 134 were formed are shown in dashed lines. The openings 134 can extend through the insulating material to expose portions of the underlying standoff or raised portion 126. The conductive material 138 can at least partially fill the openings 134 to make the electrical connection between the conductive layer 128 and portions of the underlying standoff or raised portion 126, as shown in FIG. 39. This is structurally different from a device in which the interconnection between the conductive layers 108 and 128 is formed by drilling a hole between the layers and filling that hole with conductive material, because the drilled hole does not get wider as it goes deeper. In contrast, the deeper standoff 126 portion is wider than the less deep electrically interconnecting portion formed by the conductive material 138 deposited into the opening 134. The openings 134, 118, 120 that are used to interconnect to underlying layers can be formed without drilling, such as be using etching processes. In some implementations, drilling or any other suitable technique could be used to form the openings 134, 118, 120.

In some embodiments, photo-imaging glues can be used. One reason for using photo-imaging glue in this technology can be for accuracy. Using photo processing techniques the accuracy of the apertures produced can be very accurate (about 5 μm is not unrealistic on a panel). Combined with accurate die placement, this means that very fine geometries are possible, which can be beneficial for this type of technology. The glue can resemble a solder-mask product. It can have a UV acrylate component within a thermal curing epoxy system, for example.

The process can include depositing the material, such as using a screen to print the material on the substrate. Other coating methods can also be used, such as dip, spray, or roller coating techniques. The solvent component can be driven off in a drying process. The material can be exposed using UV light through a mask or with a scanning beam (such as Laser Direct Imaging). The material that is not exposed can be developed using an aqueous developer, for example. It can be desirable that the glue is dry at room temperature to aid handling. During die placement the material may need to be warmed to reduce the viscosity to make the material tacky. The die can be pressed into the glue and can be cured. The process can include using a press to make sure the die(s) are well attached. The cure may or may not be driven through to completion, there are sometimes advantages of having the material not fully cured.

ADDITIONAL DETAILS

The principles and advantages described herein can be implemented in various apparatuses. Examples of such apparatuses can include, but are not limited to, consumer electronic products, parts of the consumer electronic products, electronic test equipment, etc. Examples of parts of consumer electronic products can include clocking circuits, analog-to-digital converters, amplifiers, rectifiers, programmable filters, attenuators, variable frequency circuits, etc. Examples of the electronic devices can also include memory chips, memory modules, circuits of optical networks or other communication networks, cellular communications infrastructure such as base stations, radar systems, and disk driver circuits, etc. Consumer electronic products can include, but are not limited to, wireless devices, a mobile phone (for example, a smart phone), a wearable computing device such as a smart watch or an ear piece, healthcare monitoring devices, vehicular electronics systems, a telephone, a television, a computer monitor, a computer, a hand-held computer, a tablet computer, a laptop computer, a personal digital assistant (PDA), a microwave, a refrigerator, a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, apparatuses can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or connected", as generally used herein, refer to two or more elements that can be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number can also include the plural or singular number, respectively. The words "or" in reference to a list of two or more items, is intended to cover all of the following interpretations of the word: any of the items in the list, all of the items in the list, and any combination of the items in the list. The words "and/or" is also intended to cover all of the following interpretations of the word: any of the items in the list, all of the items in the list, and any combination of the items in the list. The term "based on," as generally used herein, encompasses the following interpretations of the term: solely based on or based at least partly on. All numerical values provided herein are intended to include similar values, such as within a measurement error.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states.

The various features and processes described above may be used independently of one another, or may be combined in various ways. All possible combinations and subcombinations are intended to fall within the scope of this disclosure. In addition, certain method or process blocks may be omitted in some implementations. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel, or in some other manner. Blocks or states may be added to or removed from the disclosed example embodiments. The example systems and components described herein may be configured differently than described. For example, elements may be added to, removed from, or rearranged compared to the disclosed example embodiments.

The teachings of the embodiments provided herein can be applied to other systems, not necessarily the systems described above. The elements and acts of the various embodiments described above can be combined to provide further embodiments.

While certain embodiments have been described, these embodiments have been presented by way of example only, and are not intended to limit the scope of the disclosure. Indeed, the novel methods and systems described herein can be embodied in a variety of other forms. Furthermore, various omissions, substitutions and changes in the form of the methods and systems described herein can be made without departing from the spirit of the disclosure. The accompanying claims and their equivalents are intended to cover such forms or modifications as would fall within the scope and spirit of the disclosure.

What is claimed is:

1. An electrical device comprising:
    a die that has electrical circuitry and one or more contacts on a first side for sending or receiving signals to or from the electrical circuitry;
    a first conductive layer over the first side of the die and electrically coupled to the one or more contacts, wherein insulating gaps in the first conductive layer provide a first circuit pattern;
    one or more conductive standoffs over the first conductive layer and electrically coupled to one or more portions of the first conductive layer;
    a second conductive layer over the one or more conductive standoffs, wherein one or more portions of the second conductive layer are electrically coupled to the one or more conductive standoffs, and wherein insulating gaps in the second conductive layer provide a second circuit pattern; and
    insulating material between the first conductive layer and the second conductive layer and next to the one or more conductive standoffs.

2. The electrical device of claim 1, wherein the insulating material extends into a portion of the area between the second conductive layer and the one or more conductive standoffs.

3. The electrical device of claim 1, comprising:
    a portion of insulating material between the one or more conductive standoffs and the second conductive layer; and one or more openings through the portion of insulating material, wherein the one or more openings include conductive material to electrically couple the one or more conductive standoffs to the second conductive layer, wherein the one or more standoffs have a first area, and wherein the one or more openings have a second area that is smaller than the first area.

4. The electrical device of claim 1, wherein one of the conductive standoffs has a first area, and wherein the conductive standoff is electrically coupled to the second conductive layer at a second area that is smaller than the first area.

5. The electrical device of claim 1, wherein the one or more conductive standoffs are plated onto the first conductive layer.

6. The electrical device of claim 1, comprising:
a third conductive layer over a second side of the die, wherein insulating gaps in the third conductive layer provide a third circuit pattern, wherein the first conductive layer and the third conductive layer both extend laterally past an edge of the die;
an insulating spacer next to the die and between the first conductive layer and the third conductive layer; and
one or more holes through the third conductive layer, through the spacer, and at least to the first conductive layer, wherein the one or more holes include a conductive material to electrically couple the first conductive layer and the third conductive layer.

7. The electrical device of claim 6, wherein at least one of the one or more contacts on the first side of the die are electrically accessible from a portion of the third conductive layer on the second side of the die.

8. The electrical device of claim 1, comprising:
a third conductive layer over a second side of the die and electrically coupled to one or more contacts on the second side of the die, wherein insulating gaps in the third conductive layer provide a third circuit pattern;
one or more additional conductive standoffs over the third conductive layer and electrically coupled to one or more portions of the third conductive layer;
a fourth conductive layer over the one or more additional conductive standoffs, wherein one or more portions of the fourth conductive layer are electrically coupled to the one or more additional conductive standoffs, and wherein insulating gaps in the fourth conductive layer provide a fourth circuit pattern; and
insulating material between the third conductive layer and the fourth conductive layer and next to the one or more additional conductive standoffs.

9. The electrical device of claim 8, comprising:
an insulating spacer next to the die and between the first conductive layer and the fourth conductive layer, wherein the first conductive layer and the fourth conductive layer both extend laterally past an edge of the die;
one or more holes through the fourth conductive layer, through the spacer, and at least to the first conductive layer, wherein the one or more holes include a conductive material to electrically couple the first conductive layer and the fourth conductive layer.

\* \* \* \* \*